(12) United States Patent
Yeong et al.

(10) Patent No.: US 11,670,718 B2
(45) Date of Patent: *Jun. 6, 2023

(54) SEMICONDUCTOR DEVICE STRUCTURE WITH INNER SPACER

(71) Applicant: Taiwan Semiconductor Manufacturing Company, Ltd., Hsinchu (TW)

(72) Inventors: Sai-Hooi Yeong, Zhubei (TW); Chi-On Chui, Hsinchu (TW); Chien-Ning Yao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,305

(22) Filed: Mar. 7, 2022

(65) Prior Publication Data
US 2022/0190162 A1   Jun. 16, 2022

Related U.S. Application Data

(63) Continuation of application No. 16/899,832, filed on Jun. 12, 2020, now Pat. No. 11,271,113.

(51) Int. Cl.
*H01L 29/78* (2006.01)
*H01L 29/06* (2006.01)
(Continued)

(52) U.S. Cl.
CPC ...... *H01L 29/7853* (2013.01); *H01L 29/0653* (2013.01); *H01L 29/6653* (2013.01);
(Continued)

(58) Field of Classification Search
CPC ......... H01L 21/02603; H01L 21/28141; H01L 21/823431; H01L 21/823821;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

DE   10 2017 124 637 A1   2/2019
KR   10-2020-0014235 A    2/2020

OTHER PUBLICATIONS

Loubet et al., "A Novel Dry Selective Etch of SiGe for the Enablement of High Performance Logic Stacked Gate-All-Around NanoSheet Devices," In: IEEE, International Electron Device Meeting, Technical Digest, 2019, pp. 242-245.
(Continued)

*Primary Examiner* — David C Spalla
(74) *Attorney, Agent, or Firm* — Birch, Stewart, Kolasch & Birch, LLP

(57) ABSTRACT

A semiconductor device structure is provided. The semiconductor device structure includes a substrate having a base and a fin over the base. The semiconductor device structure also includes a first nanostructure over the fin and a second nanostructure over the first nanostructure. The semiconductor device structure further includes a gate stack wrapping around an upper portion of the fin, the first nanostructure, and the second nanostructure. In addition, the semiconductor device structure includes a first inner spacer between the fin and the first nanostructure and a second inner spacer between the first nanostructure and the second nanostructure. The semiconductor device structure includes a first low dielectric constant structure in the first inner spacer and a second low dielectric constant structure in the second inner spacer. The first low dielectric constant structure is larger than the second low dielectric constant structure.

20 Claims, 38 Drawing Sheets

(51) Int. Cl.
*H01L 29/66* (2006.01)
*H01L 29/423* (2006.01)

(52) U.S. Cl.
CPC ...... *H01L 29/6656* (2013.01); *H01L 29/6681* (2013.01); *H01L 29/66553* (2013.01); *H01L 29/7848* (2013.01); H01L 29/0665 (2013.01); H01L 29/42392 (2013.01)

(58) Field of Classification Search
CPC ............... H01L 21/845; H01L 27/0886; H01L 27/0924; H01L 27/10879; H01L 27/1211; H01L 29/0653; H01L 29/0665; H01L 29/0669; H01L 29/0673; H01L 29/41791; H01L 29/42392; H01L 29/66439; H01L 29/6653; H01L 29/66553; H01L 29/6656; H01L 29/66636; H01L 29/66795; H01L 29/6681; H01L 29/775; H01L 29/7848; H01L 29/785; H01L 29/7851; H01L 29/7853; H01L 29/7855; H01L 2029/7858
See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,243,061 B1 | 3/2019 | Cheng et al. |
| 2018/0358435 A1* | 12/2018 | Mochizuki .......... H01L 29/0673 |
| 2019/0081155 A1 | 3/2019 | Xie et al. |
| 2019/0157444 A1* | 5/2019 | Yang ............... H01L 21/823431 |
| 2019/0214459 A1* | 7/2019 | Cheng ............... H01L 29/42392 |
| 2019/0221483 A1* | 7/2019 | Mulfinger .............. B82Y 10/00 |
| 2020/0044060 A1 | 2/2020 | Cheng et al. |
| 2020/0083219 A1* | 3/2020 | Kang .................. H01L 29/0673 |
| 2020/0365687 A1 | 11/2020 | Xie et al. |
| 2020/0388682 A1 | 12/2020 | Jeong et al. |

OTHER PUBLICATIONS

Loubet et al., "Stacked Nanosheet gate-all around transistor to enable scaling beyond FINFET," In: Symposium on VLSI Technology, 2017, pp. 230-231.

* cited by examiner

SEMICONDUCTOR DEVICE STRUCTURE WITH INNER SPACER

PRIORITY CLAIM AND CROSS-REFERENCE

This Application is a Continuation application of U.S. patent application Ser. No. 16/899,832, filed on Jun. 12, 2020, the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1F-1 is a perspective view of the semiconductor device structure of FIG. 1F, in accordance with some embodiments.

FIG. 1F-2 is a cross-sectional view illustrating the semiconductor device structure along a sectional line 1F-2-1F-2' in FIG. 1F-1, in accordance with some embodiments.

FIG. 2E-1 is a perspective view of the semiconductor device structure of FIG. 2E, in accordance with some embodiments.

FIG. 2E-2 is a cross-sectional view illustrating the semiconductor device structure along a sectional line 2E-2-2E-2' in FIG. 2E-1, in accordance with some embodiments.

FIG. 3D-1 is a perspective view of the semiconductor device structure of FIG. 3D, in accordance with some embodiments.

FIG. 3D-2 is a cross-sectional view illustrating the semiconductor device structure along a sectional line 3D-2-3D-2' in FIG. 3D-1, in accordance with some embodiments.

FIG. 4C-1 is a perspective view of the semiconductor device structure of FIG. 4C, in accordance with some embodiments.

FIG. 4C-2 is a cross-sectional view illustrating the semiconductor device structure along a sectional line 4C-2-4C-2' in FIG. 4C-1, in accordance with some embodiments.

FIG. 5D-1 is a perspective view of the semiconductor device structure of FIG. 5D, in accordance with some embodiments.

FIG. 5D-2 is a cross-sectional view illustrating the semiconductor device structure along a sectional line 5D-2-5D-2' in FIG. 5D-1, in accordance with some embodiments.

FIG. 6C-1 is a perspective view of the semiconductor device structure of FIG. 6C, in accordance with some embodiments.

FIG. 6C-2 is a cross-sectional view illustrating the semiconductor device structure along a sectional line 6C-2-6C-2' in FIG. 6C-1, in accordance with some embodiments.

DETAILED DESCRIPTION

Figure 1A:
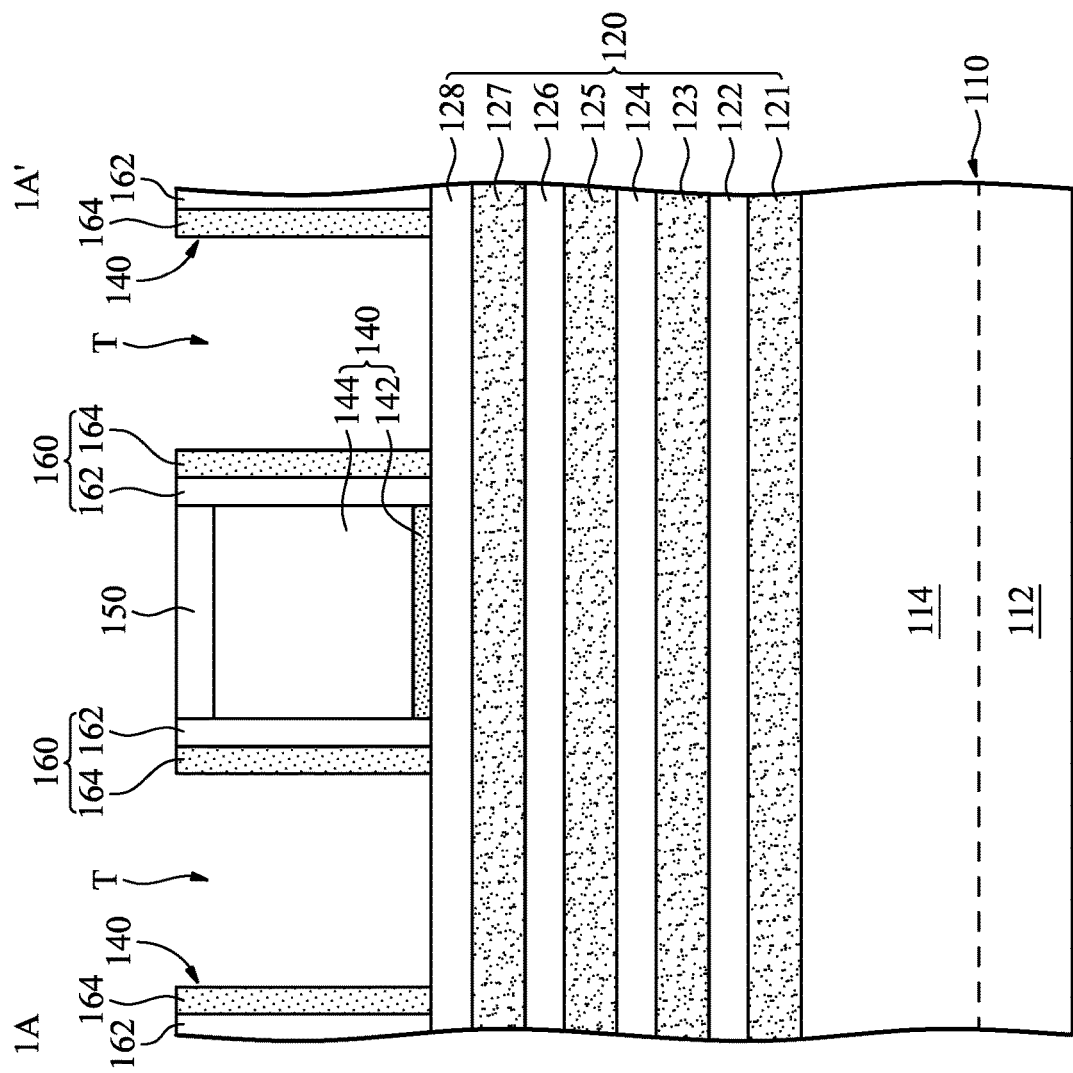
FIGS. 1A-1F are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc.

Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
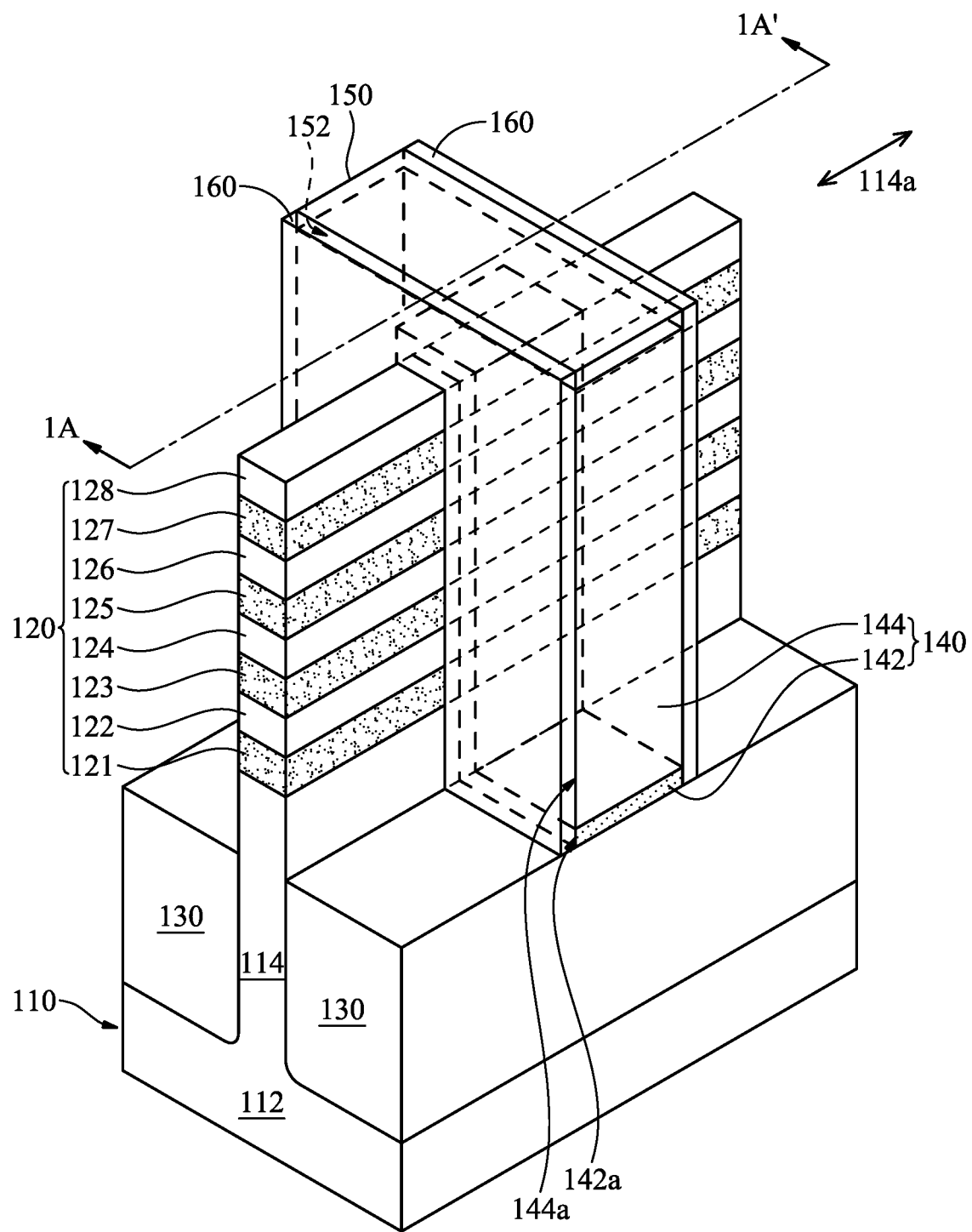

FIGS. 1A-1F are cross-sectional views of various stages of a process for forming a semiconductor device structure, in accordance with some embodiments. FIG. 1A-1 is a perspective view of the semiconductor device structure of FIG. 1A, in accordance with some embodiments.

As shown in FIGS. 1A and 1A-1, a substrate 110 is provided, in accordance with some embodiments. The substrate 110 has a base 112 and a fin 114 over the base 112, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe, or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1A and 1A-1, a nanostructure stack 120 is formed over the fin 114, in accordance with some embodiments. The nanostructure stack 120 includes nanostructures 121, 122, 123, 124, 125, 126, 127, and 128, in accordance with some embodiments.

The nanostructures 121, 122, 123, 124, 125, 126, 127, and 128 are sequentially stacked over the fin 114, in accordance with some embodiments. The nanostructures 121, 122, 123, 124, 125, 126, 127, and 128 include nanowires or nanosheets, in accordance with some embodiments.

The nanostructures 121, 123, 125, and 127 are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe, or GaAsP, or a combination thereof, in accordance with some embodiments.

The nanostructures 122, 124, 126, and 128 are made of a same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe, or GaAsP, or a combination thereof, in accordance with some embodiments.

As shown in FIGS. 1A and 1A-1, an isolation layer 130 is formed over the base 112, in accordance with some embodiments. The fin 114 is partially embedded in the isolation layer 130, in accordance with some embodiments. The fin 114 is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process or a spin-on process and a chemical mechanical polishing process and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1A and 1A-1, gate stacks 140 are formed over the nanostructure stack 120, the fin 114 and the isolation layer 130, in accordance with some embodiments. For the sake of simplicity, FIG. 1A-1 only shows one of the gate stacks 140, in accordance with some embodiments. As shown in FIG. 1A, trenches T are between the adjacent gate stacks 140 to separate the adjacent gate stacks 140 from one another, in accordance with some embodiments.

Each gate stack 140 includes a gate dielectric layer 142 and a gate electrode 144, in accordance with some embodiments. The gate electrode 144 is over the gate dielectric layer 142, in accordance with some embodiments. The gate dielectric layer 142 is positioned between the gate electrode 144 and the nanostructure stack 120, in accordance with some embodiments.

The gate dielectric layer 142 is also positioned between the gate electrode 144 and the fin 114, in accordance with some embodiments. The gate dielectric layer 142 is positioned between the gate electrode 144 and the isolation layer 130, in accordance with some embodiments.

The gate dielectric layer 142 is made of an oxide-containing material such as silicon oxide, in accordance with some embodiments. The gate dielectric layer 142 is formed using a chemical vapor deposition process and an etching process, in accordance with some embodiments. The gate electrode 144 is made of a semiconductor material such as polysilicon, in accordance with some embodiments. The gate electrode 144 is formed using a chemical vapor deposition process and an etching process, in accordance with some embodiments.

As shown in FIGS. 1A and 1A-1, a mask layer 150 is formed over the gate stacks 140, in accordance with some embodiments. The mask layer 150 is made of a material different from the materials of the gate stacks 140, in accordance with some embodiments. The mask layer 150 is made of nitrides (e.g., silicon nitride) or oxynitride (e.g., silicon oxynitride), in accordance with some embodiments.

As shown in FIGS. 1A and 1A-1, a spacer structure 160 is formed over sidewalls 142a, 144a and 152 of the gate dielectric layer 142, the gate electrode 144 and the mask layer 150, in accordance with some embodiments. The spacer structure 160 surrounds the gate stack 140 and the mask layer 150, in accordance with some embodiments. The spacer structure 160 is positioned over the nanostructure stack 120, the fin structure 114 and the isolation layer 130, in accordance with some embodiments.

The spacer structure 160 includes spacer layers 162 and 164, in accordance with some embodiments. The spacer layer 162 is between the spacer layer 164 and the gate stack 140, in accordance with some embodiments. The spacer layer 162 is also between the spacer layer 164 and the mask layer 150, in accordance with some embodiments. The spacer layers 162 and 164 are made of different materials, in accordance with some embodiments. In some other embodiments, the spacer layers 162 and 164 are made of the same material.

The spacer layers 162 and 164 include insulating materials, such as silicon oxide, silicon nitride, silicon oxynitride, or silicon carbide, in accordance with some embodiments. The spacer layers 162 and 164 are made of a material different from that of the gate stack 140 and the mask layer 150, in accordance with some embodiments. The formation of the spacer layers 162 and 164 includes deposition processes and an anisotropic etching process, in accordance with some embodiments.

Figure 1B:
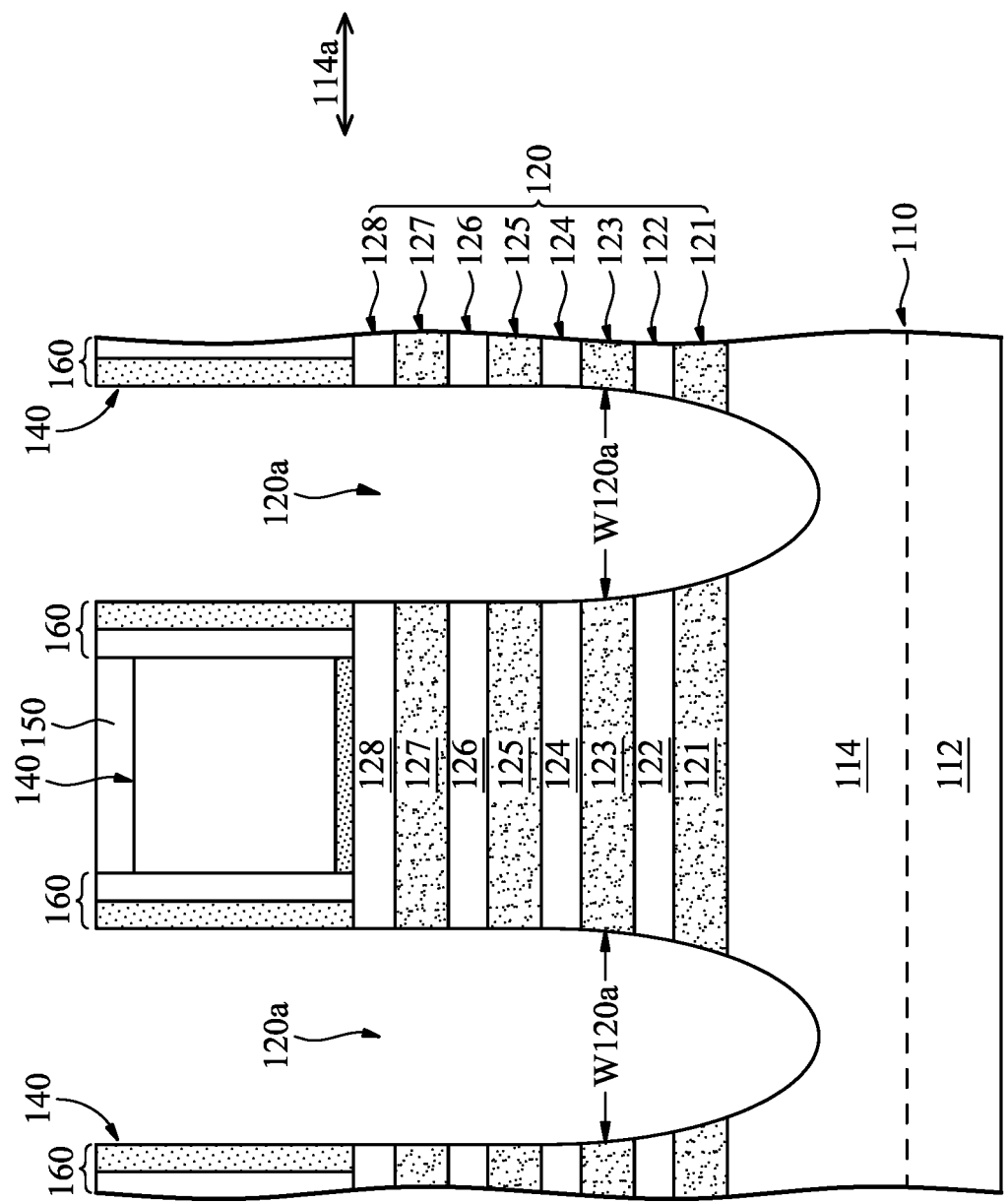

As shown in FIG. 1B, portions of the nanostructure stack 120, which are not covered by the gate stacks 140 and the spacer structure 160, are removed, in accordance with some embodiments. The removal process forms trenches 120a in the nanostructure stack 120 and the fin 114, in accordance with some embodiments.

Each trench 120a has a width W120a decreasing toward the fin 114, in accordance with some embodiments. The width W120a is measured along a longitudinal axis 114a of the fin 114, in accordance with some embodiments. The widths shown in FIGS. 1A-1F, 2A-2E, 3A-3D, 4A-4C, 5A-5D, and 6A-6C are measured along the longitudinal axis 114a of the fin 114, in accordance with some embodiments. The removal process includes an etching process, in accordance with some embodiments. The etching process includes an anisotropic etching process such as a dry etching process, in accordance with some embodiments.

Figure 1C:
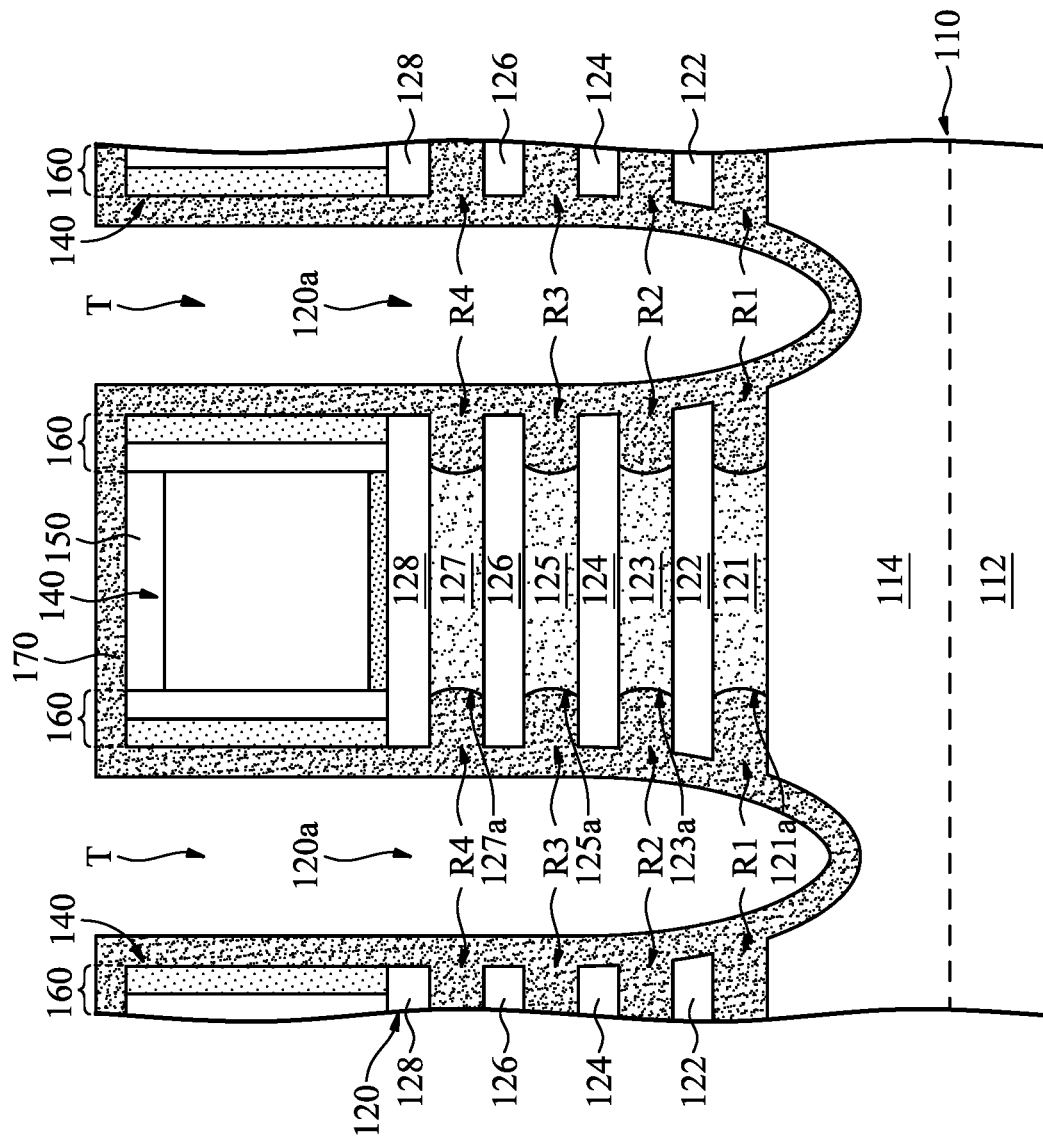

As shown in FIG. 1C, end portions of the nanostructures 121, 123, 125 and 127 are removed through the trenches 120a and T, in accordance with some embodiments. The removal process forms recesses R1, R2, R3 and R4 in the nanostructure stack 120, in accordance with some embodiments. The recess R1 is between the fin 114 and the nanostructure 122, in accordance with some embodiments.

The recess R2 is between the nanostructures 122 and 124, in accordance with some embodiments. The recess R3 is between the nanostructures 124 and 126, in accordance with some embodiments. The recess R4 is between the nanostructures 126 and 128, in accordance with some embodiments. The removal process includes an etching process such as a dry etching process or a wet etching process, in accordance with some embodiments.

As shown in FIG. 1C, an inner spacer material layer 170 is formed over the mask layer 150, the spacer structure 160, the nanostructure stack 120 and the fin 114, in accordance with some embodiments. The recesses R1, R2, R3 and R4 are filled with the inner spacer material layer 170, in accordance with some embodiments. The inner spacer material layer 170 is in direct contact with sidewalls 121a, 123a, 125a and 127a of the nanostructures 121, 123, 125 and 127, in accordance with some embodiments.

The inner spacer material layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments. The inner spacer material layer 170 is formed using a deposition process such as a physical vapor deposition process, a chemical vapor deposition process, an atomic layer deposition process, or the like, in accordance with some embodiments.

Figure 1D:
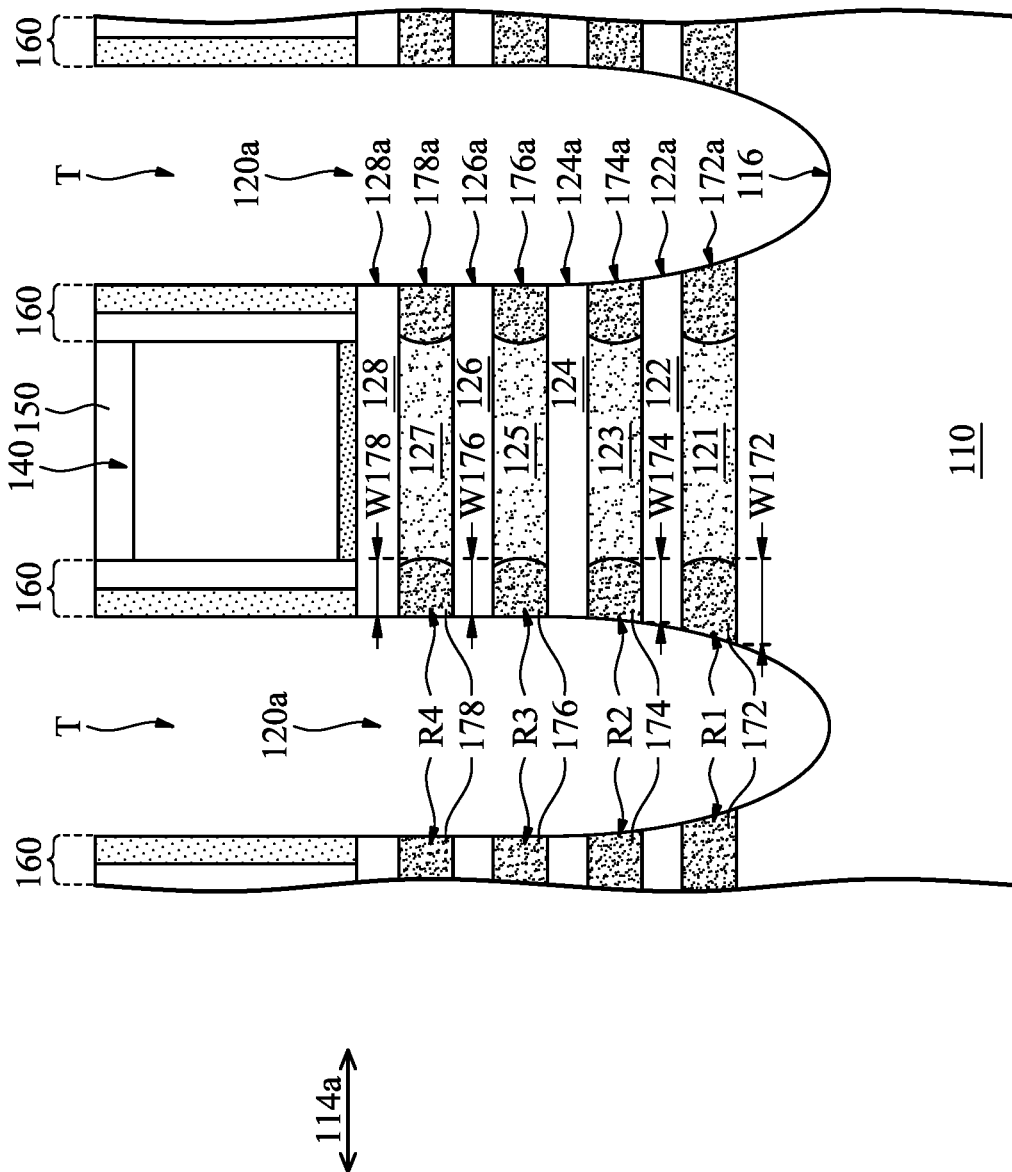

As shown in FIG. 1D, the portions of the inner spacer material layer 170 outside of the recesses R1, R2, R3 and R4 are removed to form inner spacers 172, 174, 176 and 178 in the recesses R1, R2, R3 and R4 respectively, in accordance with some embodiments. The inner spacer 172 (or the recess R1) has a width W172, in accordance with some embodiments.

The inner spacer 174 (or the recess R2) has a width W174, in accordance with some embodiments. The inner spacer 176 (or the recess R3) has a width W176, in accordance with some embodiments. The inner spacer 178 (or the recess R4) has a width W178, in accordance with some embodiments.

The width W172 is greater than the width W174, in accordance with some embodiments. That is, the inner spacer 172 (or the recess R1) is wider than the inner spacer 174 (or the recess R2), in accordance with some embodiments. The width W174 is greater than the width W176 or W178, in accordance with some embodiments. That is, the inner spacer 174 (or the recess R2) is wider than the inner spacer 176 or 178 (or the recess R3 or R4), in accordance with some embodiments.

The width W176 is substantially equal to the width W178, in accordance with some embodiments. The width W172 ranges from about 4 nm to about 14 nm, in accordance with some embodiments. The width W174 ranges from about 3 nm to about 12 nm, in accordance with some embodiments. The width W176 ranges from about 2 nm to about 10 nm, in accordance with some embodiments. The width W178 ranges from about 2 nm to about 10 nm, in accordance with some embodiments.

In some embodiments, sidewalls 128a, 178a, 126a, 176a, 124a, 174a, 122a, and 172a of the nanostructure 128, the inner spacer 178, the nanostructure 126, the inner spacer 176, the nanostructure 124, the inner spacer 174, the nanostructure 122 and the inner spacer 172 and a surface 116 of the substrate 110 together form a continuous inner wall of the trench 120a, in accordance with some embodiments.

Each of the sidewalls 128a, 178a, 126a, 176a, 124a, 174a, 122a, and 172a and the surface 116 is aligned with the adjacent sidewalls 128a, 178a, 126a, 176a, 124a, 174a, 122a, and 172a and the adjacent surface 116, in accordance with some embodiments. The sidewalls 128a, 178a, 126a, 176a, 124a, 174a, 122a, and 172a and the surface 116 together form a continuous curved inner wall of the trench 120a, in accordance with some embodiments. The sidewalls 128a, 178a, 126a, 176a, 124a, 174a, 122a, and 172a together form a continuous curved sidewall, in accordance with some embodiments.

Figure 1E:
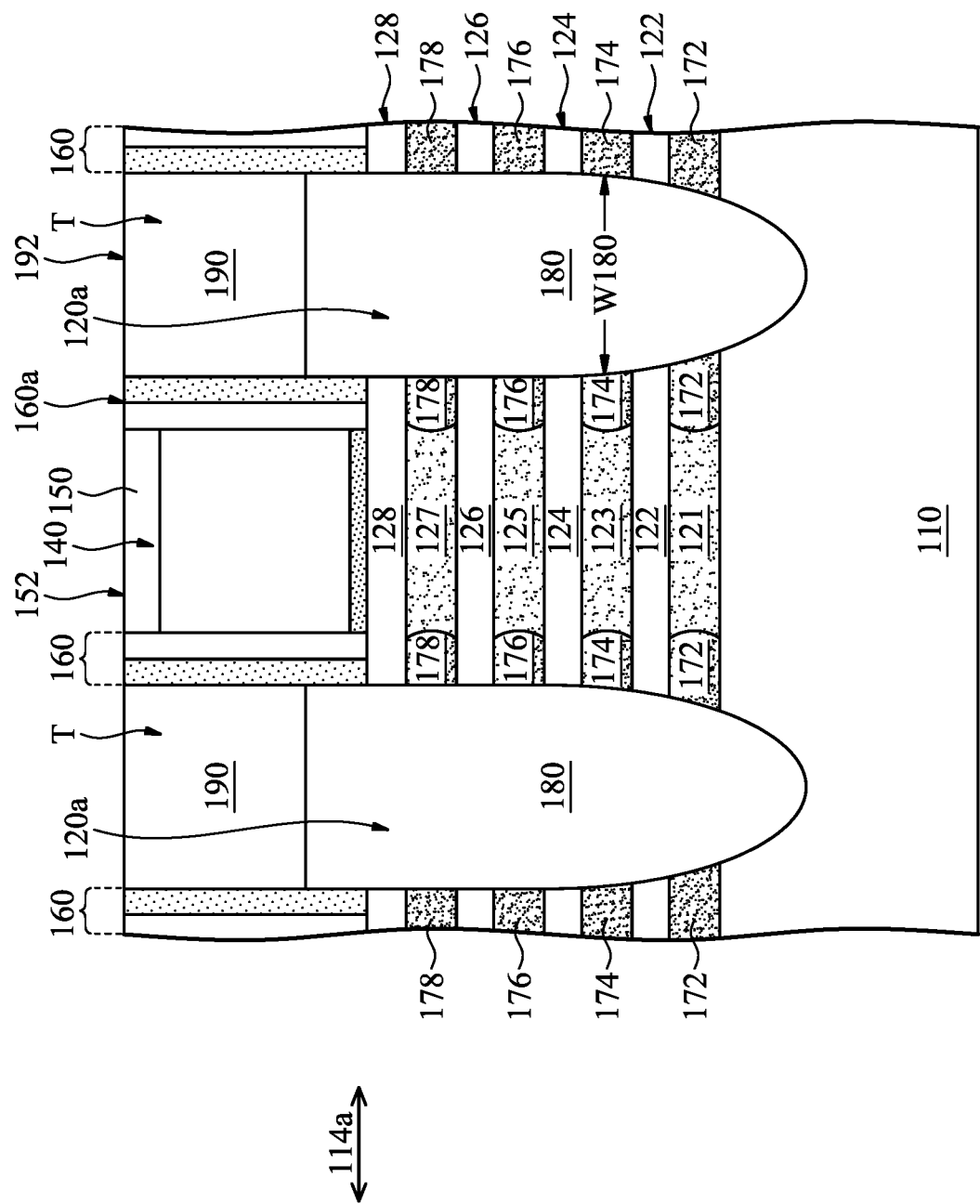

As shown in FIG. 1E, stressor structures 180 are formed in the trenches 120a, in accordance with some embodiments. The stressor structures 180 are connected to the nanostructures 122, 124, 126 and 128, in accordance with some embodiments. The stressor structures 180 are in direct contact with the nanostructures 122, 124, 126 and 128, the inner spacers 172, 174, 176 and 178, and the substrate 110, in accordance with some embodiments. Each stressor structure 180 has a width W180 decreasing toward the substrate 110, in accordance with some embodiments.

In some embodiments, the stressor structures 180 are made of a semiconductor material (e.g., silicon germanium) with P-type dopants, such as the Group IIIA element, in accordance with some embodiments. The Group IIIA element includes boron or another suitable material.

In some other embodiments, the stressor structures 180 are made of a semiconductor material (e.g., silicon) with N-type dopants, such as the Group VA element, in accordance with some embodiments. The Group VA element includes phosphor (P), antimony (Sb), or another suitable Group VA material. The stressor structures 180 are formed using an epitaxial process, in accordance with some embodiments.

As shown in FIG. 1E, a dielectric layer 190 is formed over the stressor structures 180, in accordance with some embodiments. The dielectric layer 190 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 190 is formed by a deposition process (e.g., a chemical vapor deposition process) and a planarization process (e.g., a chemical mechanical polishing process), in accordance with some embodiments.

Figure 1F:
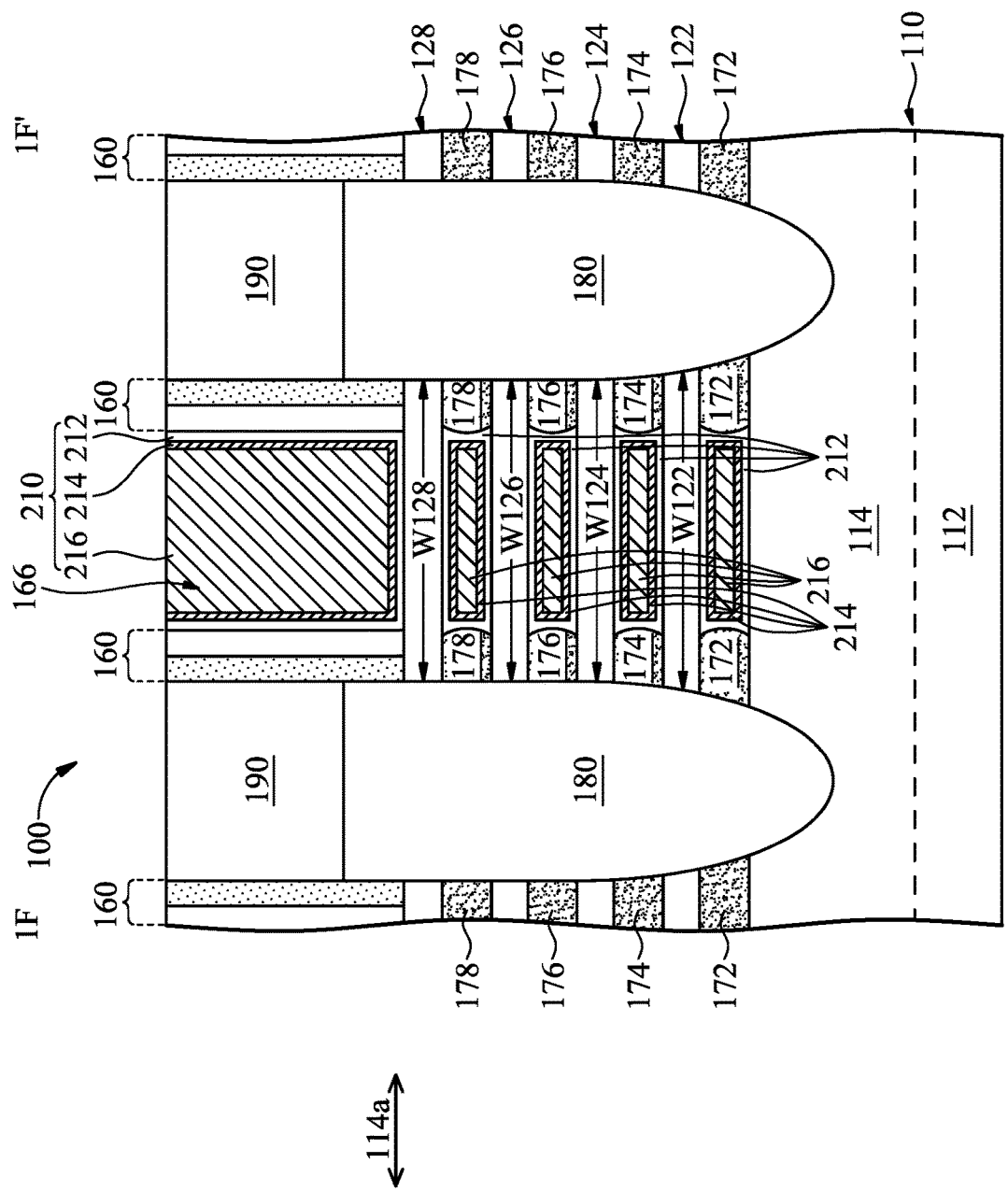
Figures 1, 1F:
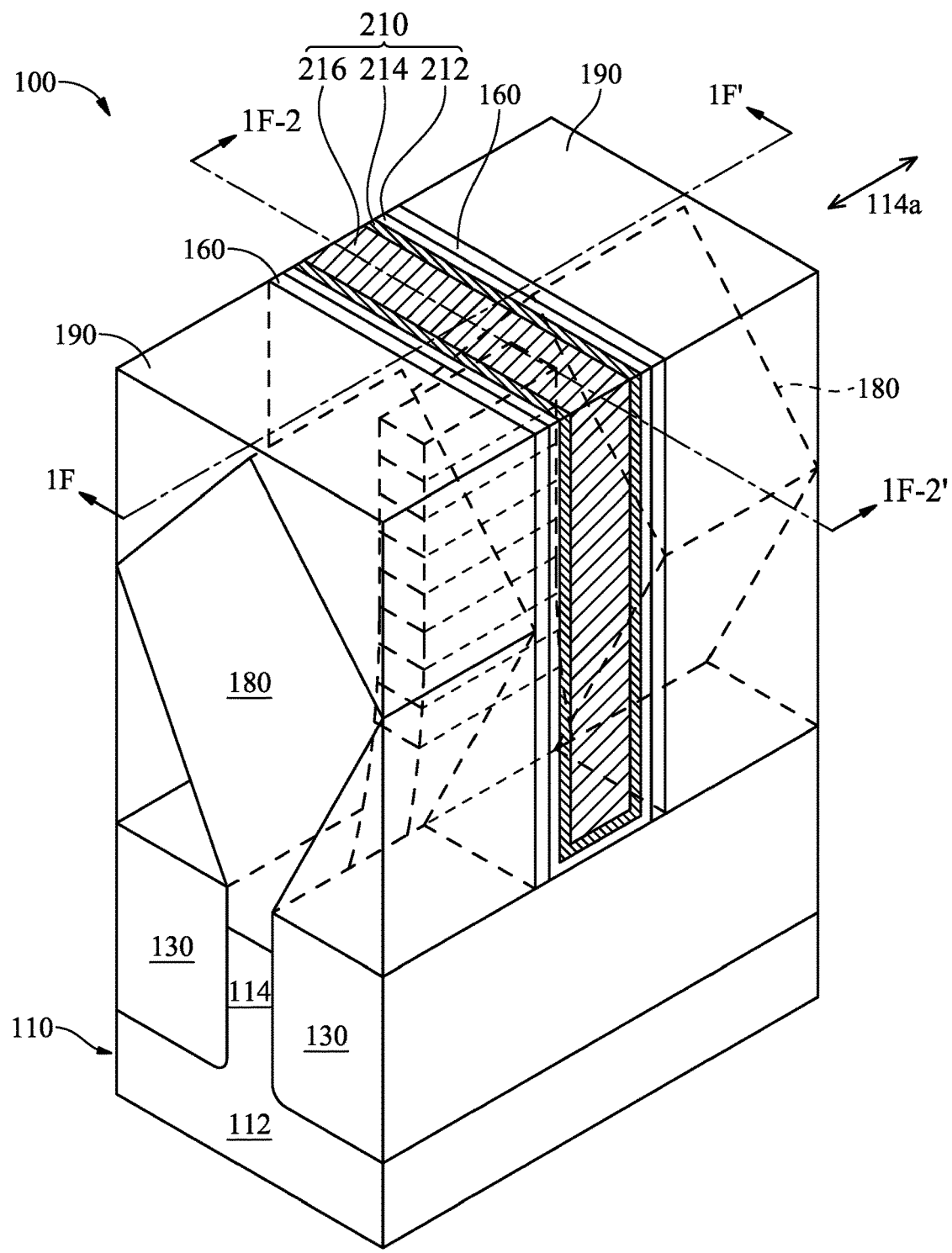

As shown in FIGS. 1E and 1F, the gate stacks 140 and the mask layer 150 are removed, in accordance with some embodiments. The removal process forms a trench 166 in the spacer structure 160, in accordance with some embodiments. As shown in FIGS. 1E and 1F, the nanostructures 121, 123, 125 and 127 are removed through the trench 166, in accordance with some embodiments. The removal process for removing the gate stacks 140, the mask layer 150 and the nanostructures 121, 123, 125 and 127 includes an etching process such as a wet etching process or a dry etching process, in accordance with some embodiments.

Figures 1, 1F, 2:
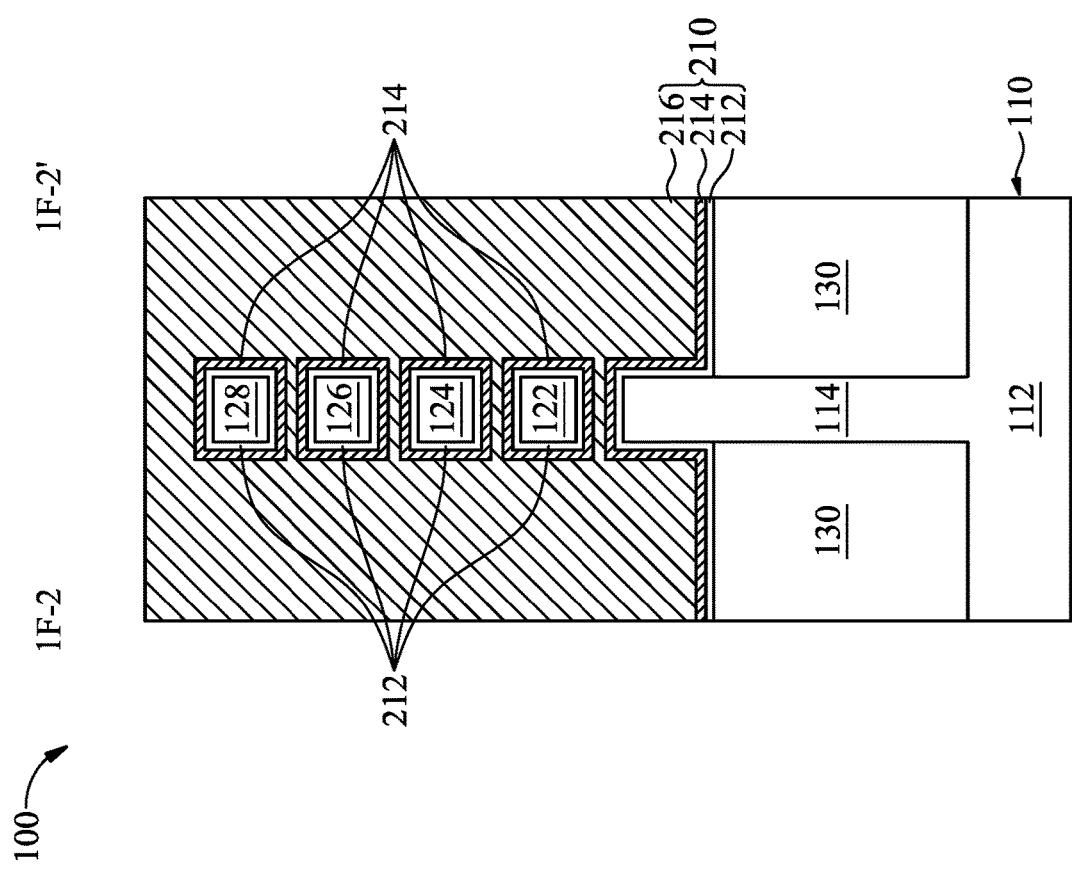

FIG. 1F-1 is a perspective view of the semiconductor device structure of FIG. 1F, in accordance with some embodiments. FIG. 1F-2 is a cross-sectional view illustrating the semiconductor device structure along a sectional line 1F-2-1F-2' in FIG. 1F-1, in accordance with some embodiments.

As shown in FIGS. 1F, 1F-1 and 1F-2, a gate stack 210 is formed in the trench 166, in accordance with some embodiments. In this step, a semiconductor device structure 100 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments. The gate dielectric layer 212 is made of a high-K material, such as $HfO_2$, $ZrO_2$, $HfZrO_2$, or $Al_2O_3$. The gate dielectric layer 212 is formed using an atomic layer deposition process or another suitable process.

The work function metal layer 214 is conformally formed over the gate dielectric layer 212, in accordance with some embodiments. The work function metal layer 214 is made of TiN, TaN, TiSiN, or another suitable conductive material. The work function metal layer 214 is formed using an atomic layer deposition process or another suitable process.

The gate electrode layer 216 is formed over the work function metal layer 214, in accordance with some embodiments. The gate electrode layer 216 is made of W, Co, Al, or another suitable conductive material. The gate electrode layer 216 is formed using an atomic layer deposition process or another suitable process.

As shown in FIG. 1F, the nanostructures 122, 124, 126 and 128 pass through the gate stack 210, in accordance with some embodiments. The nanostructure 122 is wider than the nanostructure 124, in accordance with some embodiments. That is, a width W122 of the nanostructure 122 is greater than a width W124 of the nanostructure 124, in accordance with some embodiments.

The nanostructure 124 is wider than the nanostructure 126, in accordance with some embodiments. That is, a width W124 of the nanostructure 124 is greater than a width W126 of the nanostructure 126, in accordance with some embodiments. The width W126 is substantially equal to a width W128 of the nanostructure 128, in accordance with some embodiments.

The stressor structure 180 adjacent to the nanostructure 122 is narrower than the stressor structure 180 adjacent to the nanostructure 124, in accordance with some embodiments. The stressor structure 180 adjacent to the inner spacer 172 is narrower than the stressor structure 180 adjacent to the inner spacer 174, in accordance with some embodiments. The fin 114 and the nanostructures 122, 124, 126 and 128 are spaced apart from each other, in accordance with some embodiments.

Figure 2A:
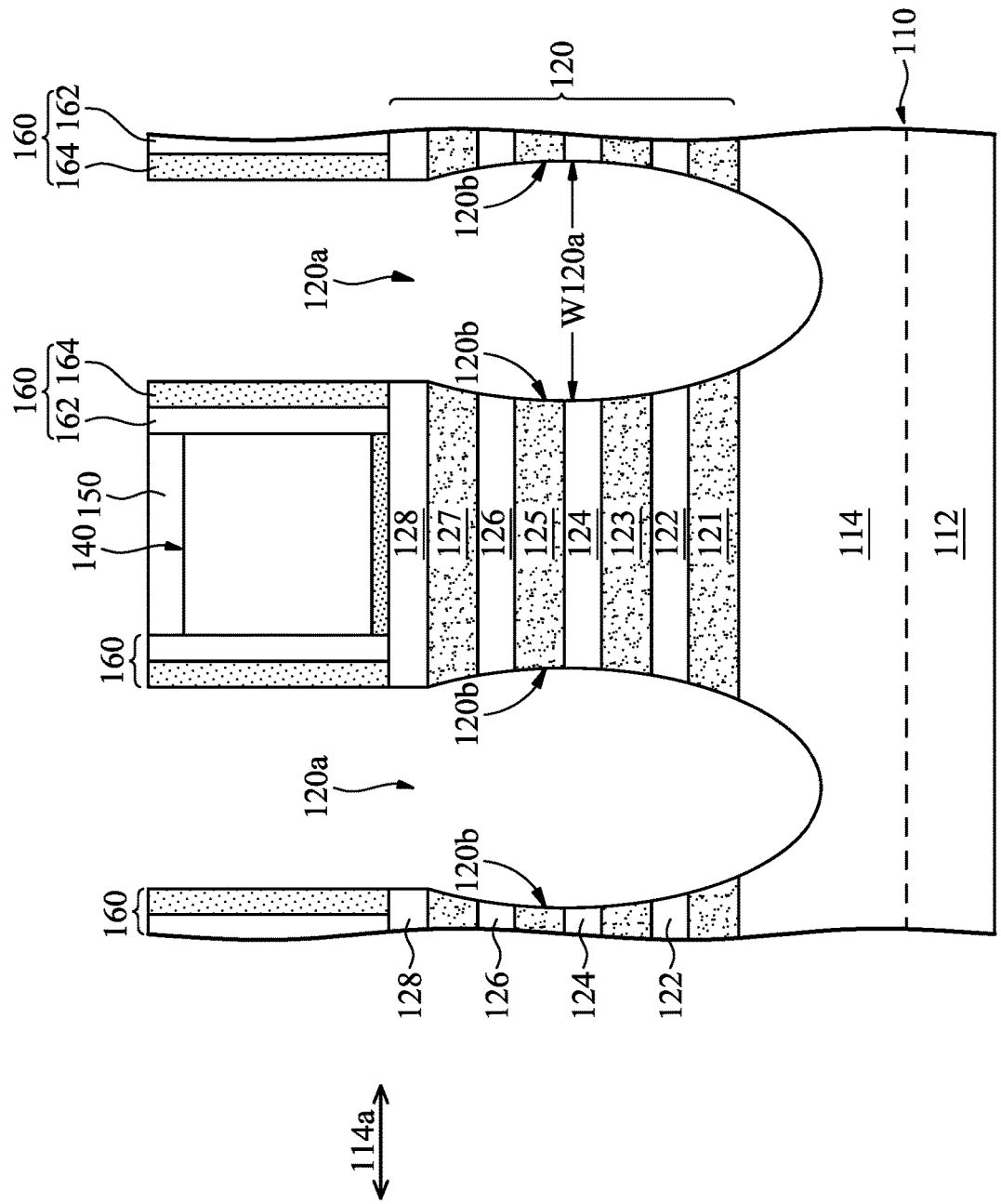
FIGS. 2A-2E are cross-sectional views of various stages of a process for forming a semiconductor device structure, in accordance with some embodiments.

FIGS. 2A-2E are cross-sectional views of various stages of a process for forming a semiconductor device structure, in accordance with some embodiments. After the step of FIG. 1B, as shown in FIG. 2A, portions of the nanostructure stack 120 are removed from inner walls 120b of the trenches 120a to widen the trenches 120a, in accordance with some embodiments.

The nanostructure 128 is wider than the nanostructure 122, in accordance with some embodiments. The nanostructure 122 is wider than the nanostructure 126, in accordance with some embodiments. The nanostructure 126 is wider than the nanostructure 124, in accordance with some embodiments. The removal process includes an isotropic etching process or a wet etching process, in accordance with some embodiments.

Figure 2B:
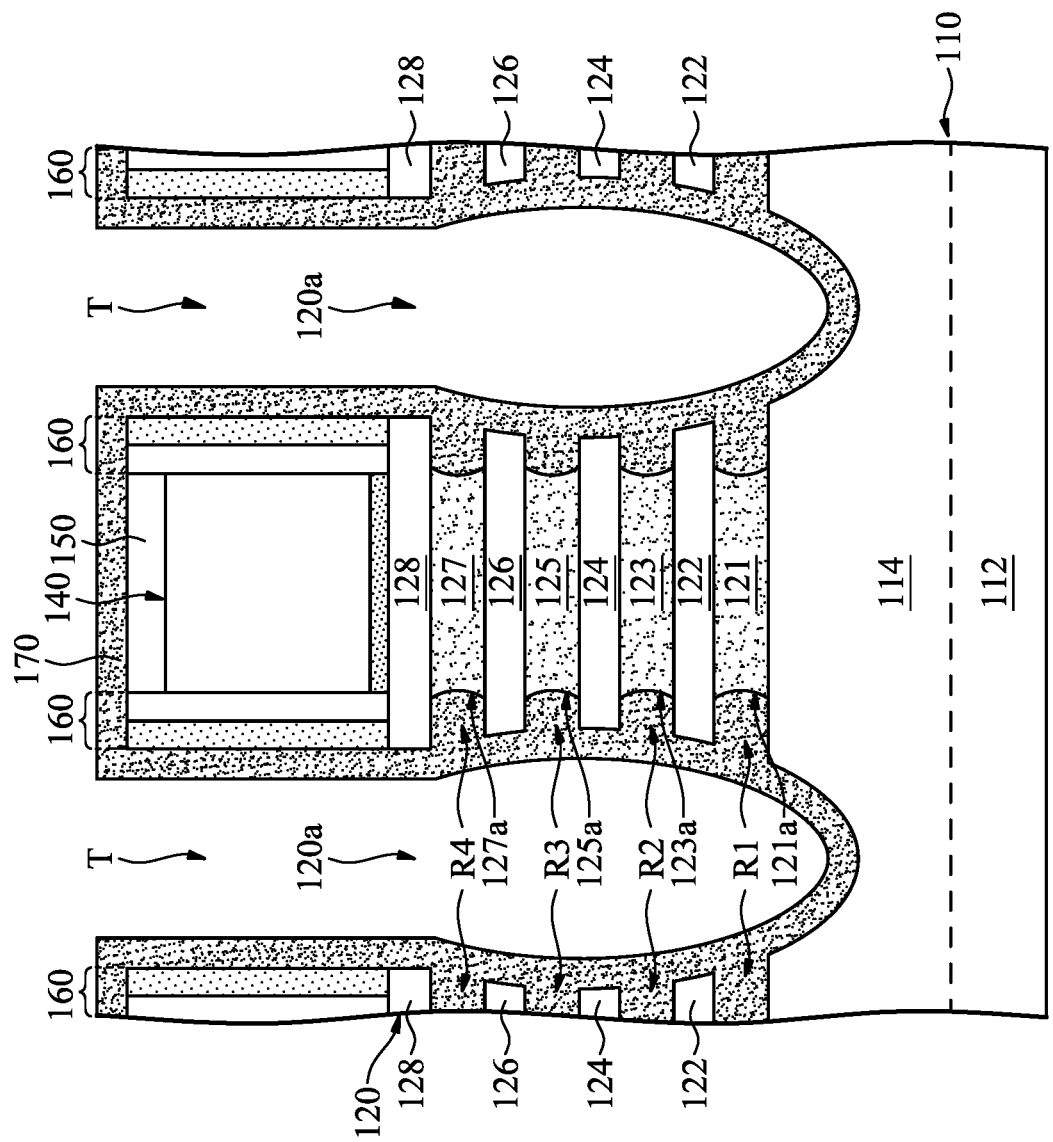

As shown in FIG. 2B, end portions of the nanostructures 121, 123, 125 and 127 are removed through the trenches 120a and T, in accordance with some embodiments. The removal process forms recesses R1, R2, R3 and R4 in the nanostructure stack 120, in accordance with some embodiments. The recess R1 is between the fin 114 and the nanostructure 122, in accordance with some embodiments.

The recess R2 is between the nanostructures 122 and 124, in accordance with some embodiments. The recess R3 is between the nanostructures 124 and 126, in accordance with some embodiments. The recess R4 is between the nanostructures 126 and 128, in accordance with some embodiments. The removal process includes an etching process such as a dry etching process or a wet etching process, in accordance with some embodiments.

As shown in FIG. 2B, an inner spacer material layer 170 is formed over the mask layer 150, the spacer structure 160, the nanostructure stack 120 and the fin 114, in accordance with some embodiments. The recesses R1, R2, R3 and R4 are filled with the inner spacer material layer 170, in accordance with some embodiments. The inner spacer material layer 170 is in direct contact with sidewalls 121a, 123a, 125a and 127a of the nanostructures 121, 123, 125 and 127, in accordance with some embodiments.

Figure 2C:
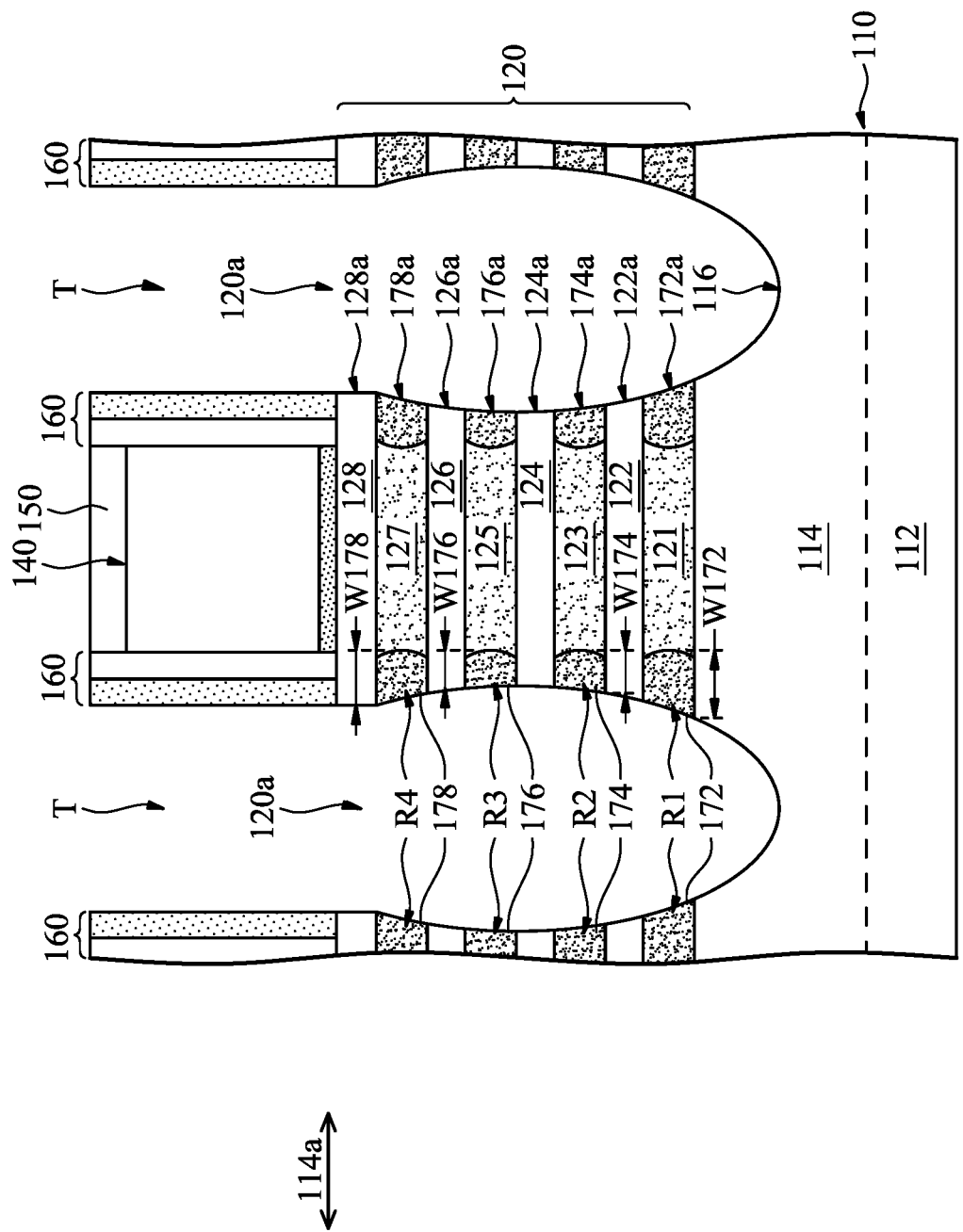

As shown in FIG. 2C, the portions of the inner spacer material layer 170 outside of the recesses R1, R2, R3 and R4 are removed to form inner spacers 172, 174, 176 and 178 in the recesses R1, R2, R3 and R4 respectively, in accordance with some embodiments. The inner spacer 172 (or the recess R1) has a width W172, in accordance with some embodiments. The inner spacer 174 (or the recess R2) has a width W174, in accordance with some embodiments. The inner spacer 176 (or the recess R3) has a width W176, in accordance with some embodiments. The inner spacer 178 (or the recess R4) has a width W178, in accordance with some embodiments.

The width W172 is greater than the width W178, in accordance with some embodiments. That is, the inner spacer 172 (or the recess R1) is wider than the inner spacer 178 (or the recess R4), in accordance with some embodiments. The width W178 is greater than the width W176 or W174, in accordance with some embodiments. That is, the inner spacer 178 (or the recess R4) is wider than the inner spacer 176 or 174 (or the recess R3 or R2), in accordance with some embodiments.

The width W176 is substantially equal to the width W174, in accordance with some embodiments. The width W172 ranges from about 4 nm to about 14 nm, in accordance with some embodiments. The width W174 ranges from about 2 nm to about 9 nm, in accordance with some embodiments. The width W176 ranges from about 2 nm to about 9 nm, in accordance with some embodiments. The width W178 ranges from about 3 nm to about 10 nm, in accordance with some embodiments.

In some embodiments, sidewalls 128a, 178a, 126a, 176a, 124a, 174a, 122a, and 172a of the nanostructure 128, the inner spacer 178, the nanostructure 126, the inner spacer 176, the nanostructure 124, the inner spacer 174, the nanostructure 122 and the inner spacer 172 and a surface 116 of the substrate 110 together form a continuous inner wall of the trench 120a, in accordance with some embodiments.

Each of the sidewalls 128a, 178a, 126a, 176a, 124a, 174a, 122a, and 172a and the surface 116 is aligned with the adjacent sidewalls 128a, 178a, 126a, 176a, 124a, 174a, 122a, and 172a and the adjacent surface 116, in accordance with some embodiments. The removal process includes an etching process such as a wet etching process or a dry etching process, in accordance with some embodiments.

Figure 2D:
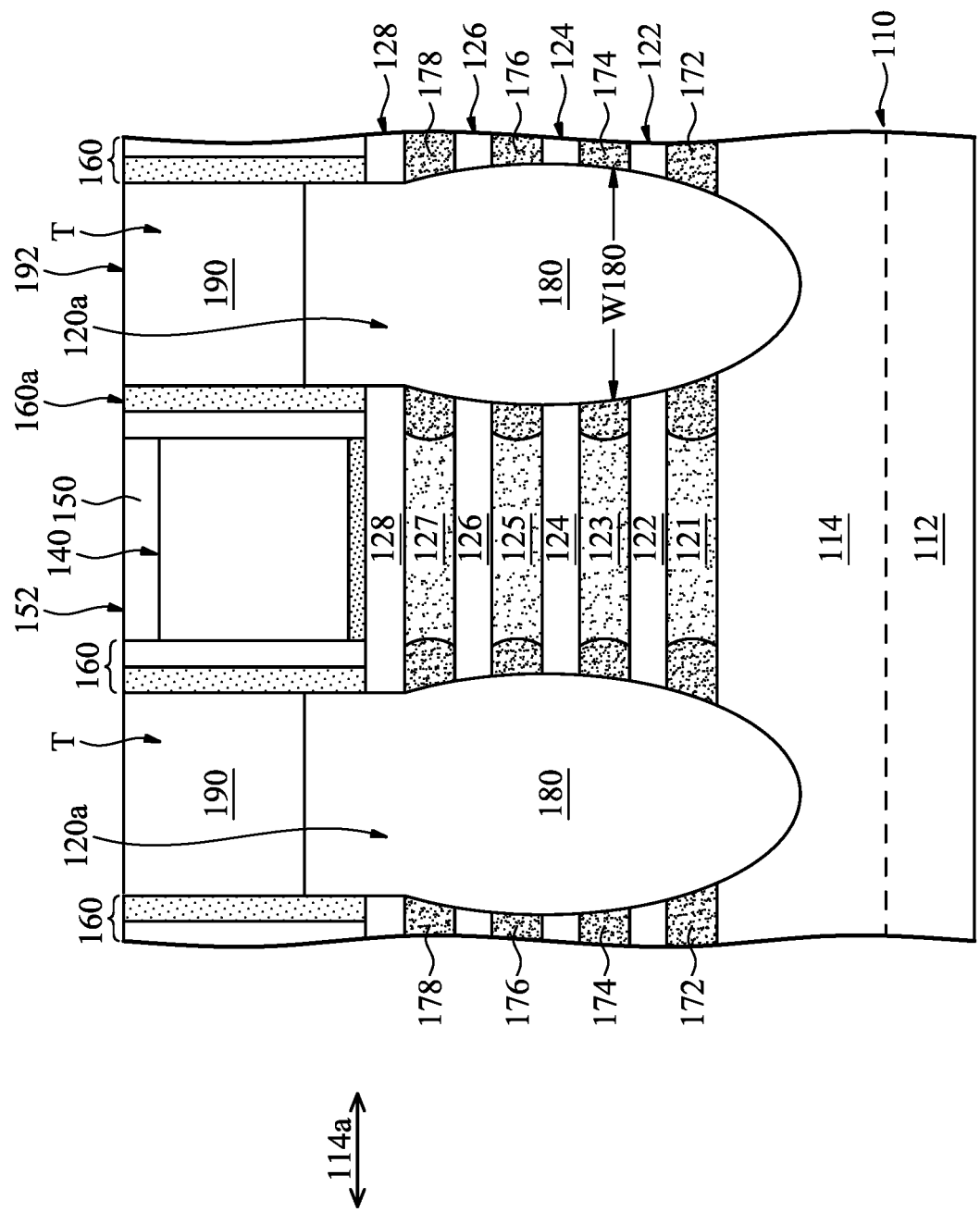

As shown in FIG. 2D, stressor structures 180 are formed in the trenches 120a, in accordance with some embodiments. The stressor structures 180 are connected to the nanostructures 122, 124, 126 and 128, in accordance with some embodiments. The stressor structures 180 are in direct contact with the nanostructures 122, 124, 126 and 128, the inner spacers 172, 174, 176 and 178, and the substrate 110, in accordance with some embodiments.

As shown in FIG. 2D, a dielectric layer 190 is formed over the stressor structures 180, in accordance with some embodiments. The stressor structures 180 has a width W180 continuously decreasing toward the fin 114, in accordance with some embodiments. The width W180 also continuously decreases toward the dielectric layer 190, in accordance with some embodiments.

Figure 2E:
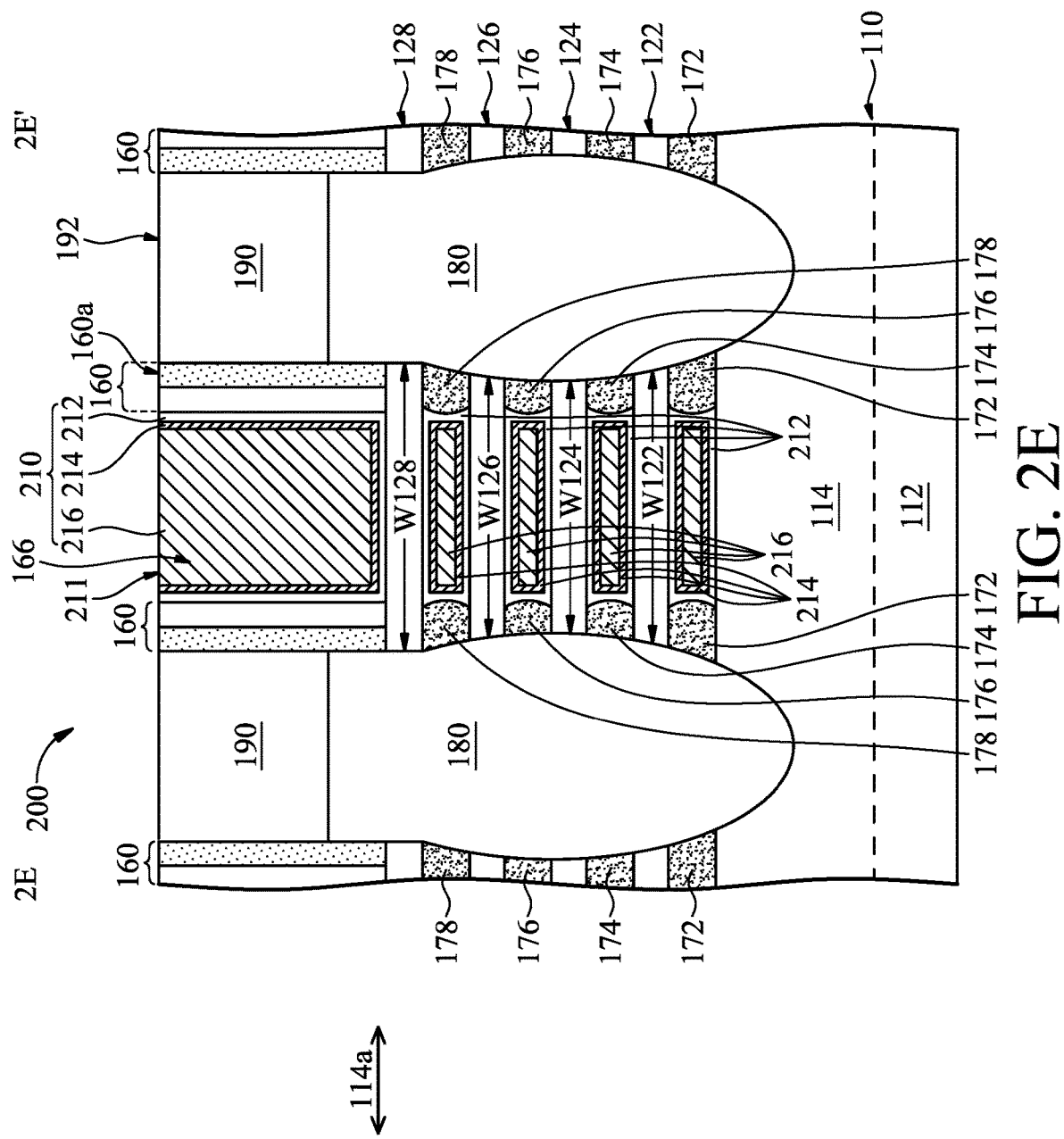
Figures 1, 2E:
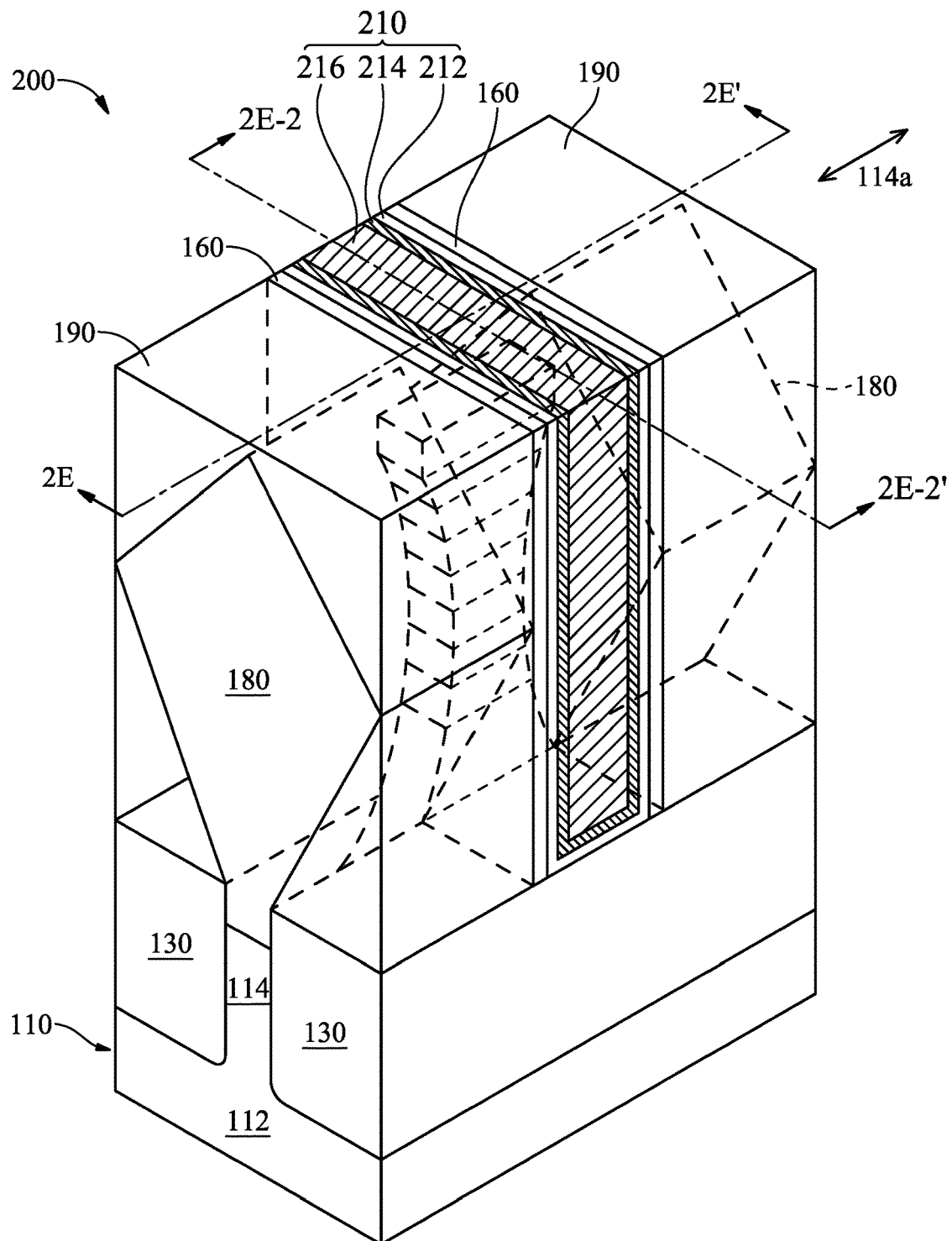
Figures 2, 2E:
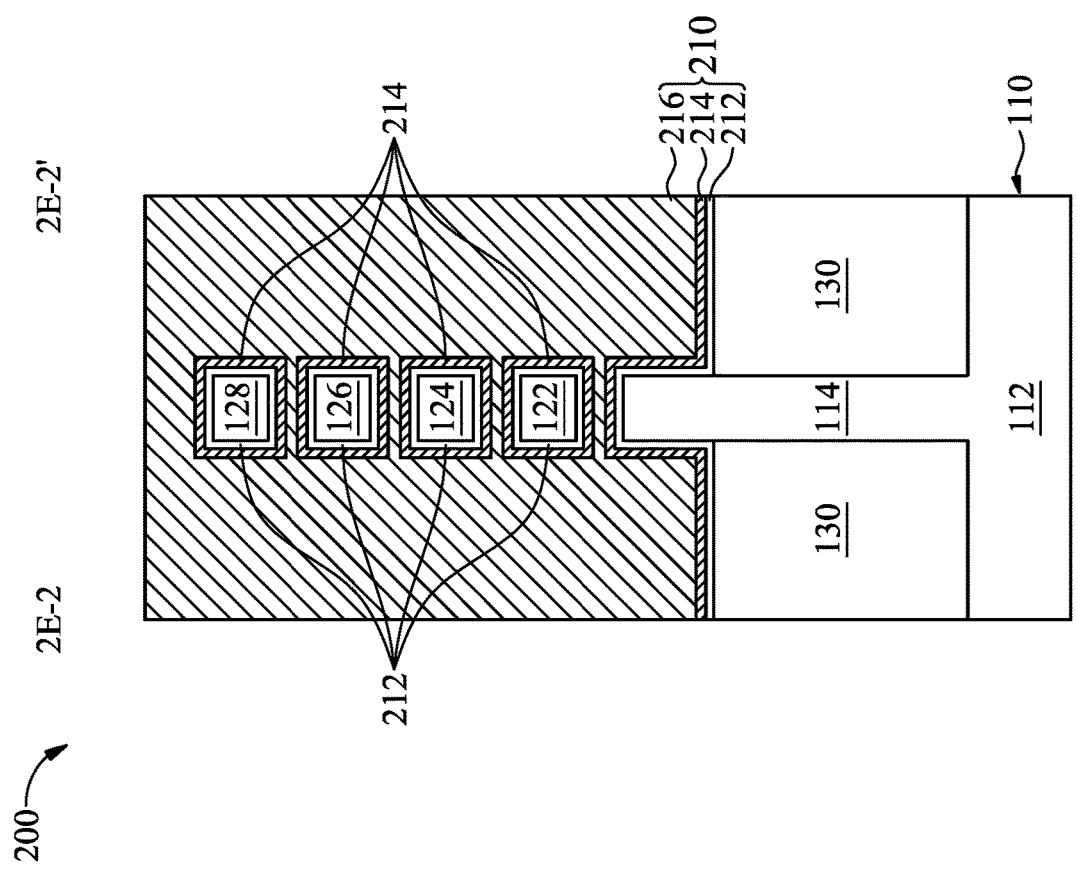

As shown in FIGS. 2D and 2E, the gate stacks 140 and the mask layer 150 are removed, in accordance with some embodiments. The removal process forms a trench 166 in the spacer structure 160, in accordance with some embodiments. As shown in FIGS. 2D and 2E, the nanostructures 121, 123, 125 and 127 are removed through the trench 166, in accordance with some embodiments. The removal process for removing the gate stacks 140, the mask layer 150 and the nanostructures 121, 123, 125 and 127 includes an etching process such as a wet etching process or a dry etching process, in accordance with some embodiments.

FIG. 2E-1 is a perspective view of the semiconductor device structure of FIG. 2E, in accordance with some embodiments. FIG. 2E-2 is a cross-sectional view illustrating the semiconductor device structure along a sectional line 2E-2-2E-2' in FIG. 2E-1, in accordance with some embodiments.

As shown in FIGS. 2E, 2E-1 and 2E-2, a gate stack 210 is formed in the trench 166, in accordance with some embodiments. In this step, a semiconductor device structure 200 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments. The work function metal layer 214 is conformally formed over the gate dielectric layer 212, in accordance with some embodiments. The gate electrode layer 216 is formed over the work function metal layer 214, in accordance with some embodiments.

As shown in FIG. 2E, the nanostructures 122, 124, 126 and 128 pass through the gate stack 210, in accordance with some embodiments. In some embodiments, a width W128 of the nanostructure 128 is greater than a width W122 of the nanostructure 122. The width W122 is greater than a width W126 of the nanostructure 126, in accordance with some embodiments. The width W126 is greater than a width W124 of the nanostructure 124, in accordance with some embodiments.

While the semiconductor device structure 200 is in operation, the current is applied into the stressor structure 180 from a top portion of the stressor structure 180, in accordance with some embodiments. Therefore, the current may flow more easily into upper nanostructures (e.g., the nanostructure 128) than into lower nanostructures (e.g., the nanostructure 124 or 122), which decreases uniformity in current flowing through the nanostructures 122, 124, 126 and 128. Since the nanostructure 128 is wider, the electrical resistance is larger, which reduces the current flowing through the nanostructure 128 and therefore improves uniformity in current flowing through the nanostructures 122, 124, 126 and 128.

The stressor structure 180 adjacent to the nanostructure 122 is narrower than the stressor structure 180 adjacent to the nanostructure 124, in accordance with some embodiments. The stressor structure 180 adjacent to the nanostructure 126 is narrower than the stressor structure 180 adjacent to the nanostructure 124, in accordance with some embodiments.

The stressor structure 180 adjacent to the nanostructure 128 is narrower than the stressor structure 180 adjacent to the nanostructure 126, in accordance with some embodiments. The stressor structure 180 adjacent to the inner spacer 172 is narrower than the stressor structure 180 adjacent to the inner spacer 174, in accordance with some embodiments. The fin 114 and the nanostructures 122, 124, 126 and 128 are spaced apart from each other, in accordance with some embodiments.

Figure 3A:
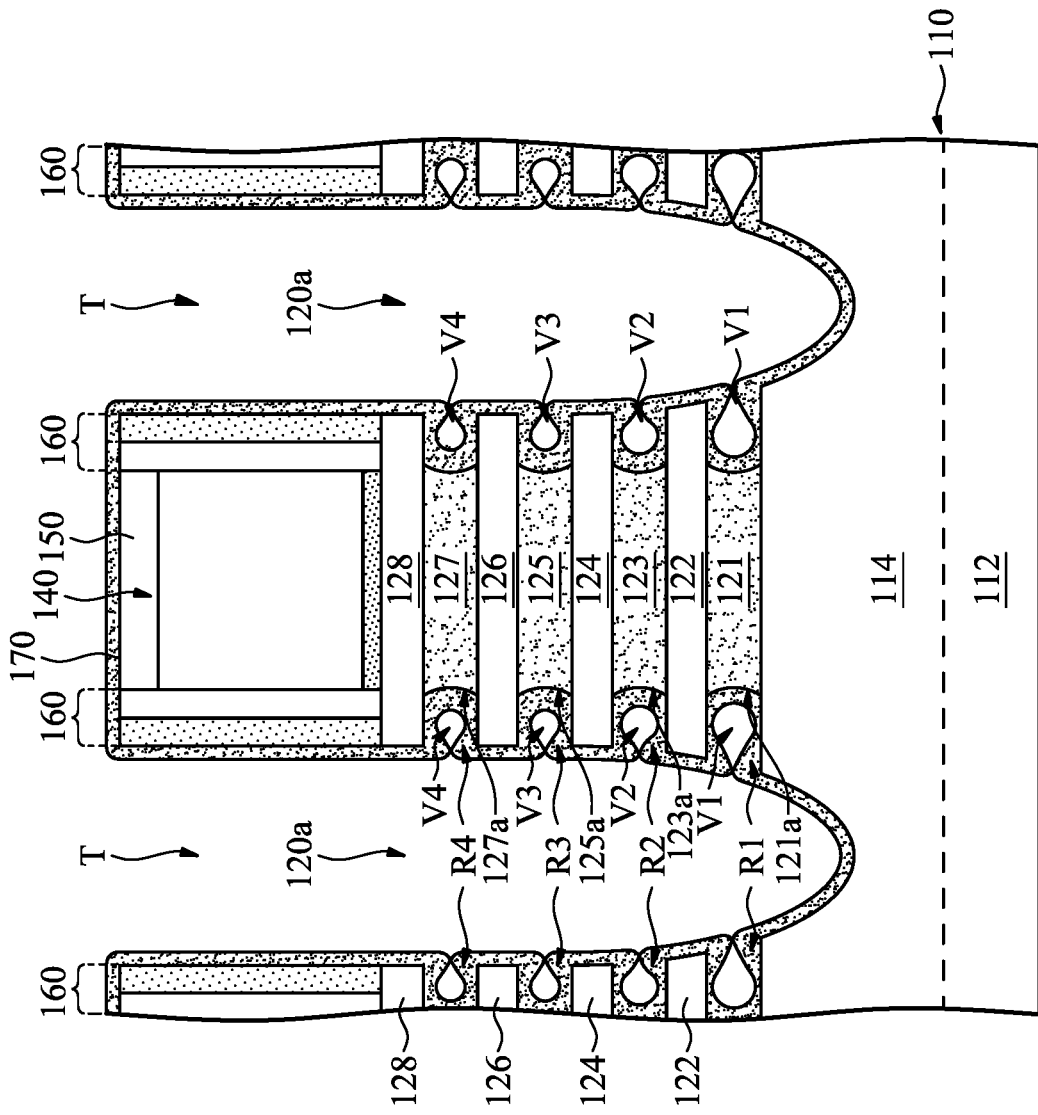
FIGS. 3A-3D are cross-sectional views of various stages of a process for forming a semiconductor device structure, in accordance with some embodiments.

FIGS. 3A-3D are cross-sectional views of various stages of a process for forming a semiconductor device structure, in accordance with some embodiments. After the step of FIG. 1B, as shown in FIG. 3A, end portions of the nanostructures 121, 123, 125 and 127 are removed through the trenches 120a and T, in accordance with some embodiments. The removal process forms recesses R1, R2, R3 and R4 in the nanostructure stack 120, in accordance with some embodiments. The recess R1 is between the fin 114 and the nanostructure 122, in accordance with some embodiments.

The recess R2 is between the nanostructures 122 and 124, in accordance with some embodiments. The recess R3 is between the nanostructures 124 and 126, in accordance with some embodiments. The recess R4 is between the nanostructures 126 and 128, in accordance with some embodiments. The removal process includes an etching process such as a dry etching process or a wet etching process, in accordance with some embodiments.

As shown in FIG. 3A, an inner spacer material layer 170 is conformally formed over the mask layer 150, the spacer structure 160, the nanostructure stack 120 and the fin 114, in accordance with some embodiments. The recesses R1, R2, R3 and R4 are covered by the inner spacer material layer 170, in accordance with some embodiments. The inner spacer material layer 170 is in direct contact with sidewalls 121a, 123a, 125a and 127a of the nanostructures 121, 123, 125 and 127, in accordance with some embodiments.

The inner spacer material layer 170 has voids V1, V2, V3 and V4, in accordance with some embodiments. The voids V1, V2, V3 and V4 are respectively in the recesses R1, R2, R3 and R4, in accordance with some embodiments. The voids V1, V2, V3 and V4 are also referred to as air gaps, in accordance with some embodiments. The inner spacer material layer 170 is formed using a deposition process such as a physical vapor deposition process, a chemical vapor deposition process, an atomic layer deposition process, or the like, in accordance with some embodiments.

Figure 3B:
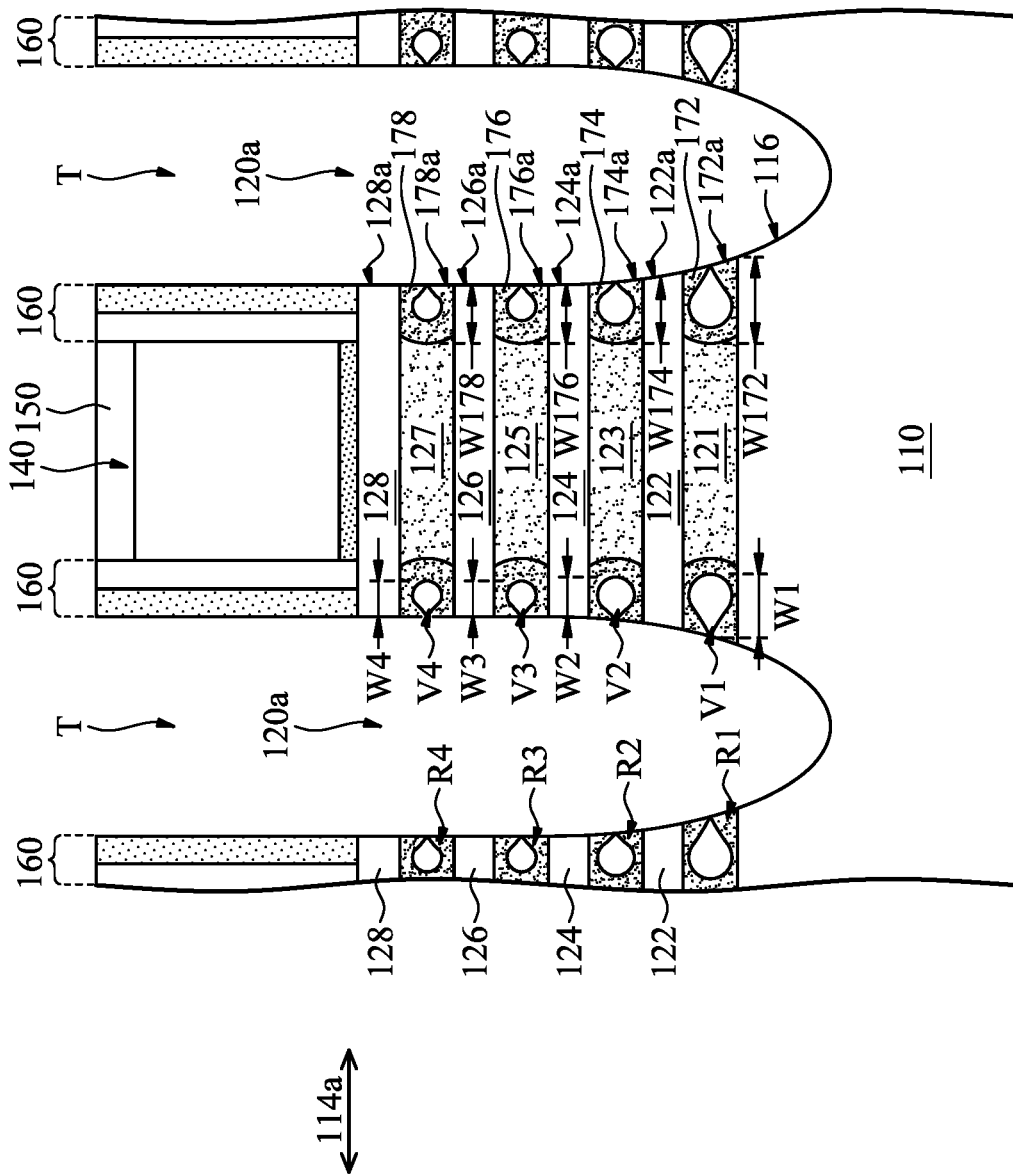

As shown in FIGS. 3A and 3B, the portions of the inner spacer material layer 170 outside of the recesses R1, R2, R3 and R4 are removed to form inner spacers 172, 174, 176 and 178 in the recesses R1, R2, R3 and R4 respectively, in accordance with some embodiments. In some embodiments, the voids V1, V2, V3 and V4 are closed voids. In some other embodiments, the voids V1, V2, V3 and V4 are open voids.

The void V1 has a width W1, in accordance with some embodiments. The void V2 has a width W2, in accordance with some embodiments. The void V3 has a width W3, in accordance with some embodiments. The void V4 has a width W4, in accordance with some embodiments.

The width W1 is greater than the width W2, in accordance with some embodiments. That is, the void V1 is wider than the void V2, in accordance with some embodiments. The width W2 is greater than the width W3 or W4, in accordance with some embodiments. That is, the void V2 is wider than the void V3 or V4, in accordance with some embodiments.

The width W3 is substantially equal to the width W4, in accordance with some embodiments. The width W1 ranges from about 5 nm to about 10 nm, in accordance with some embodiments. The width W2 ranges from about 4 nm to about 8 nm, in accordance with some embodiments. The width W3 ranges from about 3 nm to about 6 nm, in accordance with some embodiments. The width W4 ranges from about 3 nm to about 6 nm, in accordance with some embodiments.

In some embodiments, sidewalls 128a, 178a, 126a, 176a, 124a, 174a, 122a, and 172a of the nanostructure 128, the inner spacer 178, the nanostructure 126, the inner spacer 176, the nanostructure 124, the inner spacer 174, the nanostructure 122 and the inner spacer 172 and a surface 116 of the substrate 110 together form a continuous inner wall of the trench 120a, in accordance with some embodiments. Each of the sidewalls 128a, 178a, 126a, 176a, 124a, 174a, 122a, and 172a and the surface 116 is aligned with the adjacent sidewalls 128a, 178a, 126a, 176a, 124a, 174a, 122a, and 172a and the adjacent surface 116, in accordance with some embodiments.

Figure 3C:
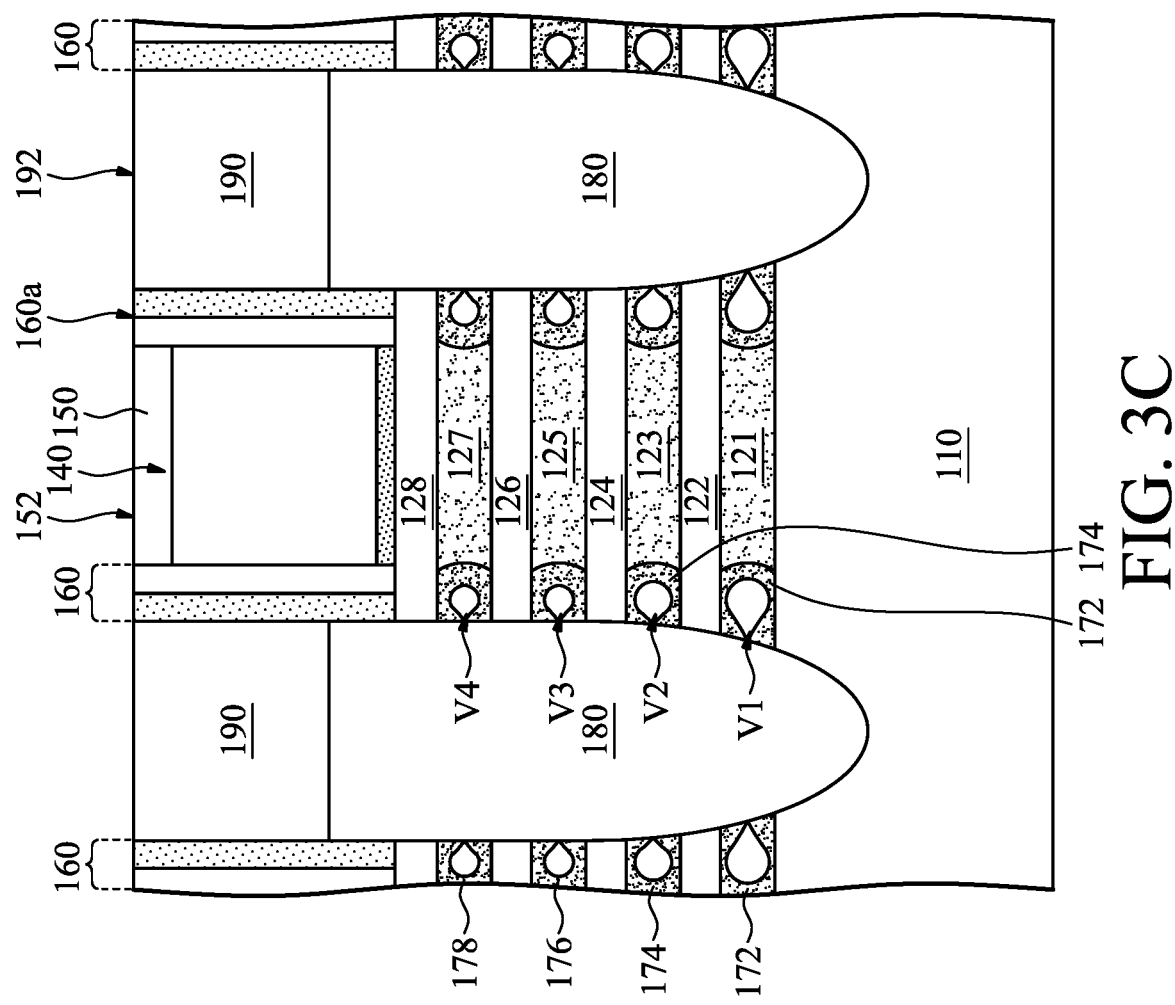

As shown in FIG. 3C, stressor structures 180 are formed in the trenches 120a, in accordance with some embodiments. The stressor structures 180 are connected to the nanostructures 122, 124, 126 and 128, in accordance with some embodiments. The stressor structures 180 are in direct contact with the nanostructures 122, 124, 126 and 128, the inner spacers 172, 174, 176 and 178, and the substrate 110, in accordance with some embodiments. As shown in FIG. 3C, a dielectric layer 190 is formed over the stressor structures 180, in accordance with some embodiments.

Figure 3D:
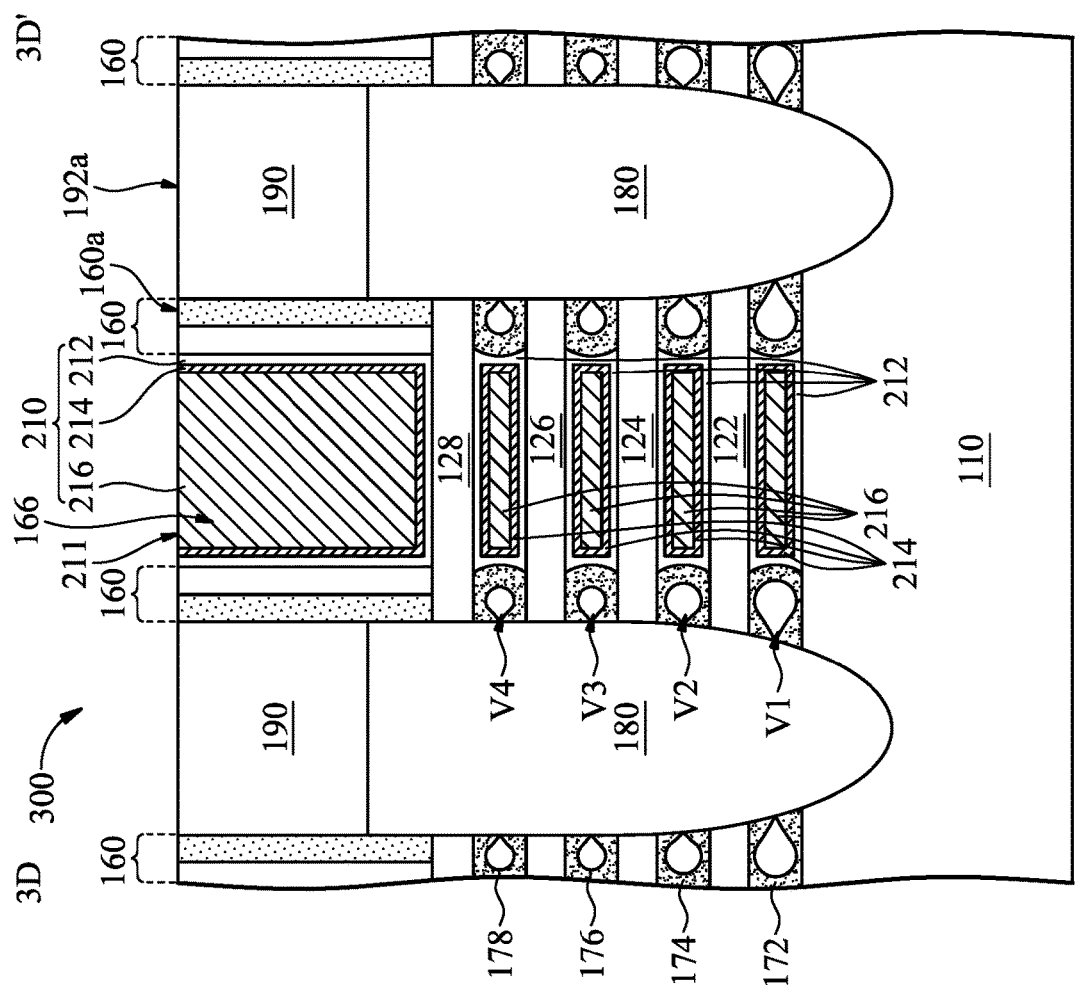
Figures 1, 3D:
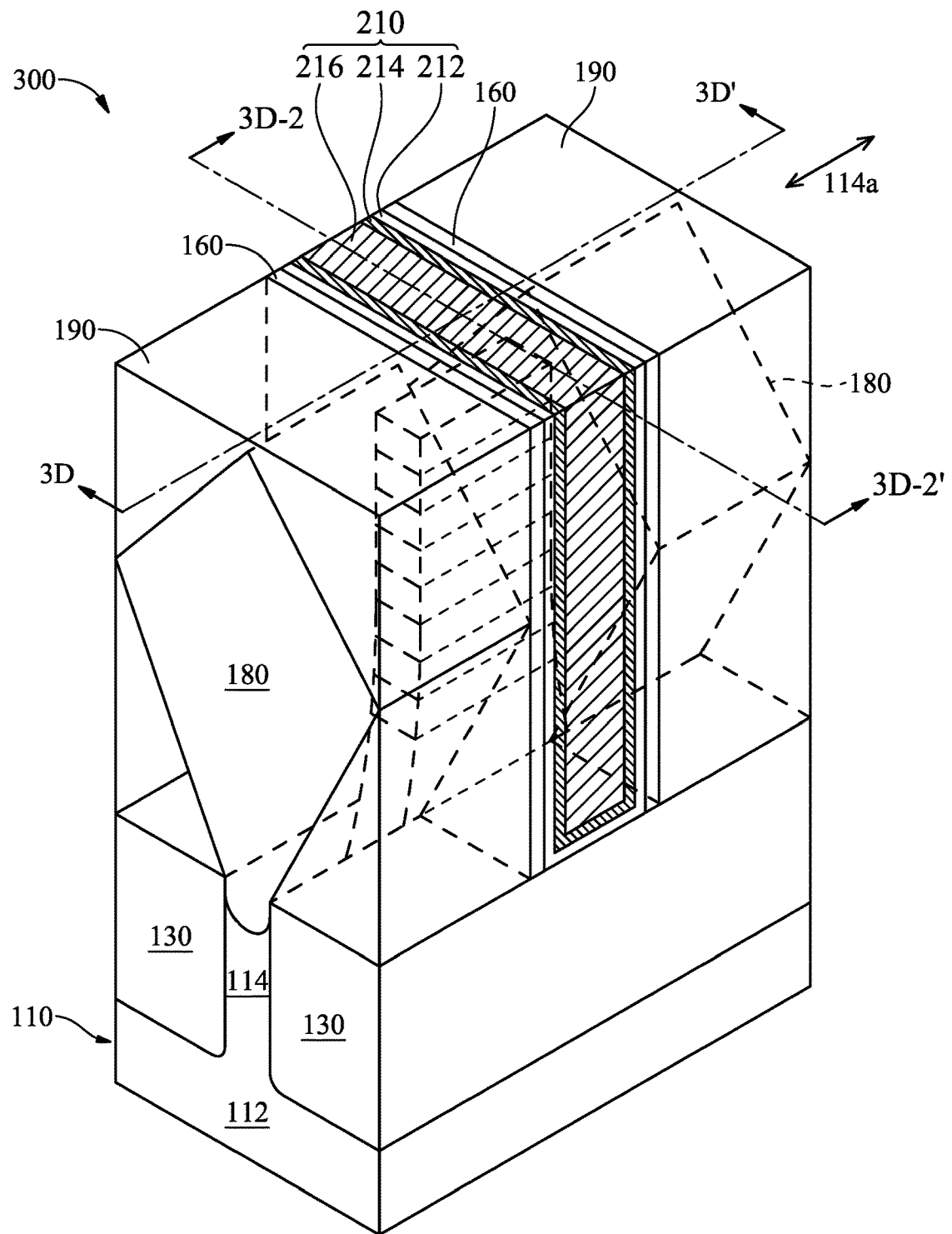
Figures 2, 3D:
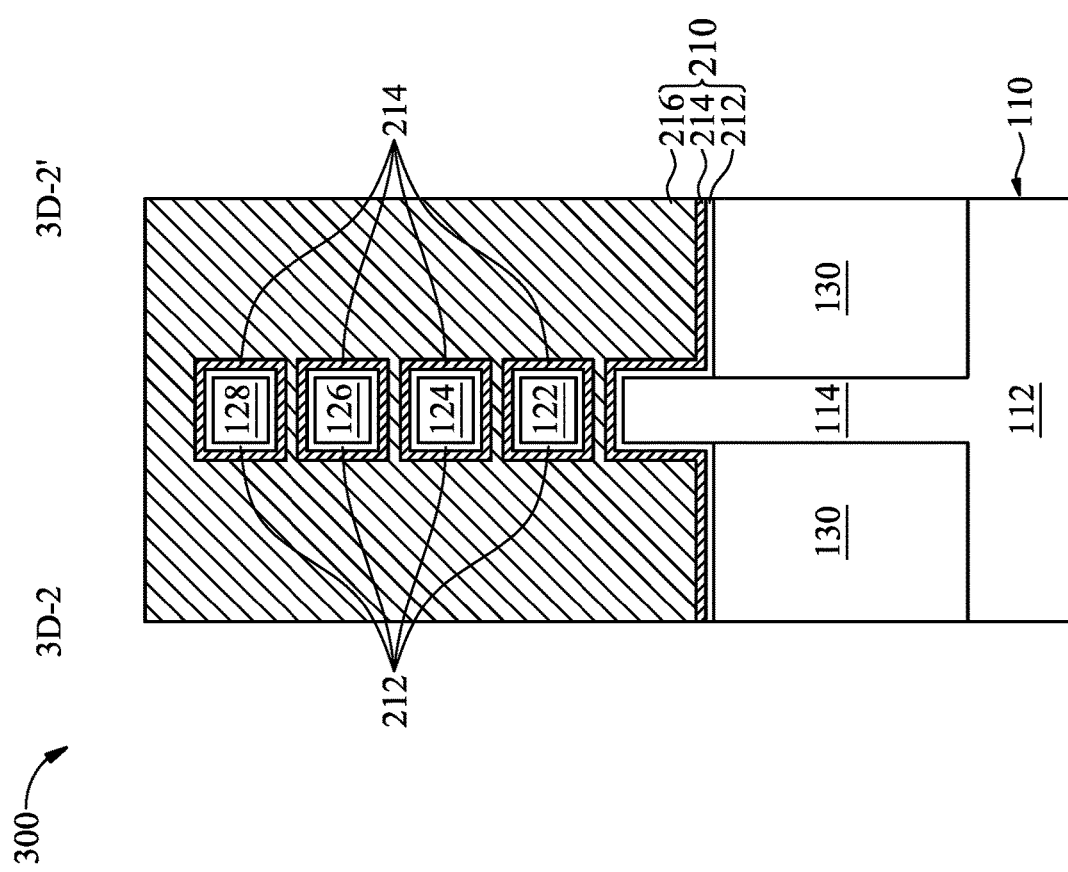

As shown in FIGS. 3C and 3D, the gate stacks 140 and the mask layer 150 are removed, in accordance with some embodiments. The removal process forms a trench 166 in the spacer structure 160, in accordance with some embodiments. As shown in FIGS. 3C and 3D, the nanostructures 121, 123, 125 and 127 are removed through the trench 166, in accordance with some embodiments.

FIG. 3D-1 is a perspective view of the semiconductor device structure of FIG. 3D, in accordance with some embodiments. FIG. 3D-2 is a cross-sectional view illustrating the semiconductor device structure along a sectional line 3D-2-3D-2' in FIG. 3D-1, in accordance with some embodiments.

As shown in FIGS. 3D, 3D-1 and 3D-2, a gate stack 210 is formed in the trench 166, in accordance with some embodiments. In this step, a semiconductor device structure 300 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments. The work function metal layer 214 is conformally formed over the gate dielectric layer 212, in accordance with some embodiments. The gate electrode layer 216 is formed over the work function metal layer 214, in accordance with some embodiments.

As shown in FIG. 3D, the voids V1, V2, V3 and V4 are filled with air, in accordance with some embodiments. That is, the voids V1, V2, V3 and V4 are air gaps, in accordance with some embodiments. Since air has a low dielectric constant (about 1), the formation of the voids V1, V2, V3 and V4 is able to reduce the parasitic capacitance between the gate stack 210 and the stressor structures 180, in accordance with some embodiments. Therefore, the performance of the semiconductor device structure 300 is improved, in accordance with some embodiments.

The voids V1, V2, V3 and V4 have a teardrop shape (or a water drop shape), in accordance with some embodiments. The nanostructure 122 is wider than the nanostructure 124, in accordance with some embodiments. The nanostructure 124 is wider than the nanostructure 126 or 128, in accordance with some embodiments.

The stressor structure 180 adjacent to the nanostructure 122 is narrower than the stressor structure 180 adjacent to the nanostructure 124, in accordance with some embodiments. The stressor structure 180 adjacent to the inner spacer 172 is narrower than the stressor structure 180 adjacent to the inner spacer 174, in accordance with some embodiments. The stressor structure 180 adjacent to the inner spacer 174 is narrower than the stressor structure 180 adjacent to the inner spacer 176, in accordance with some embodiments.

Figure 4A:
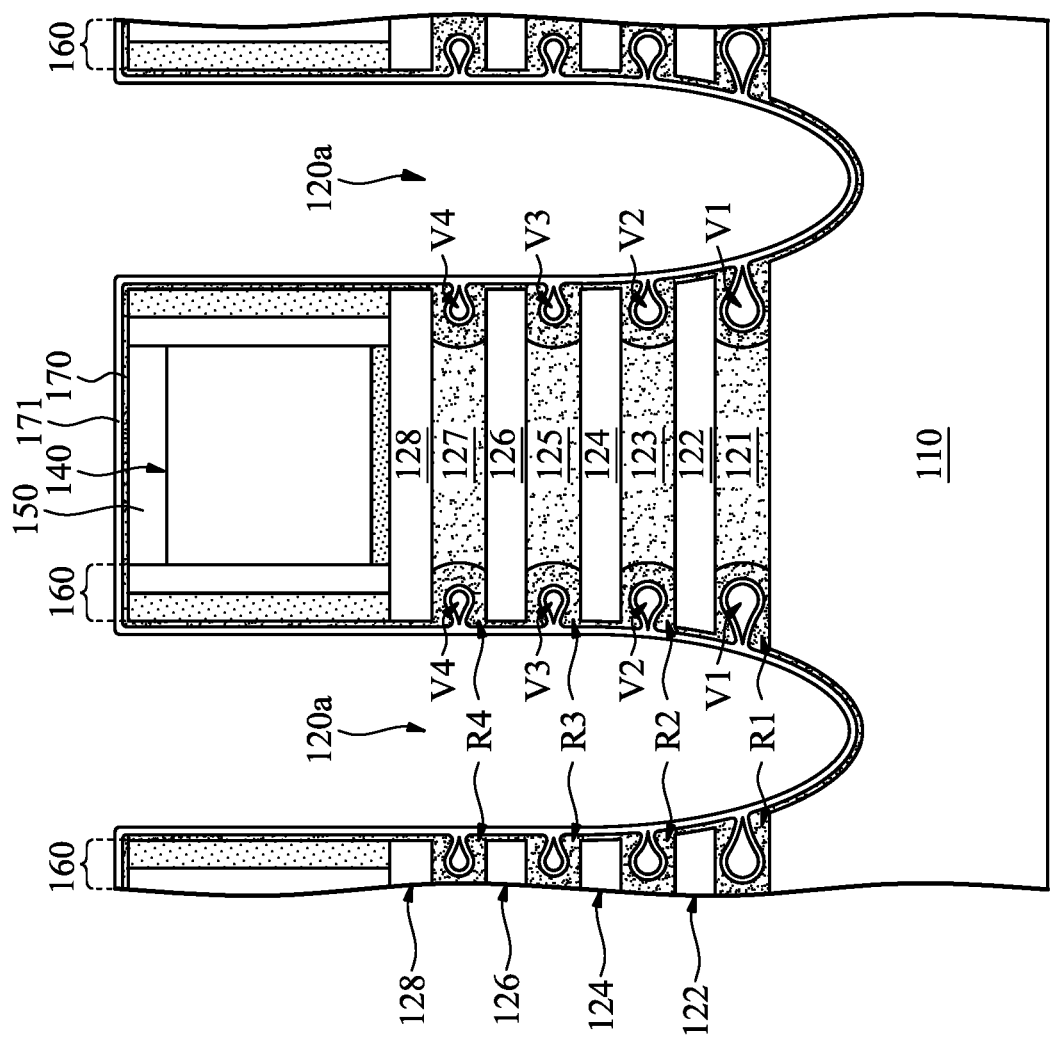
FIGS. 4A-4C are cross-sectional views of various stages of a process for forming a semiconductor device structure, in accordance with some embodiments.
Figure 4B:
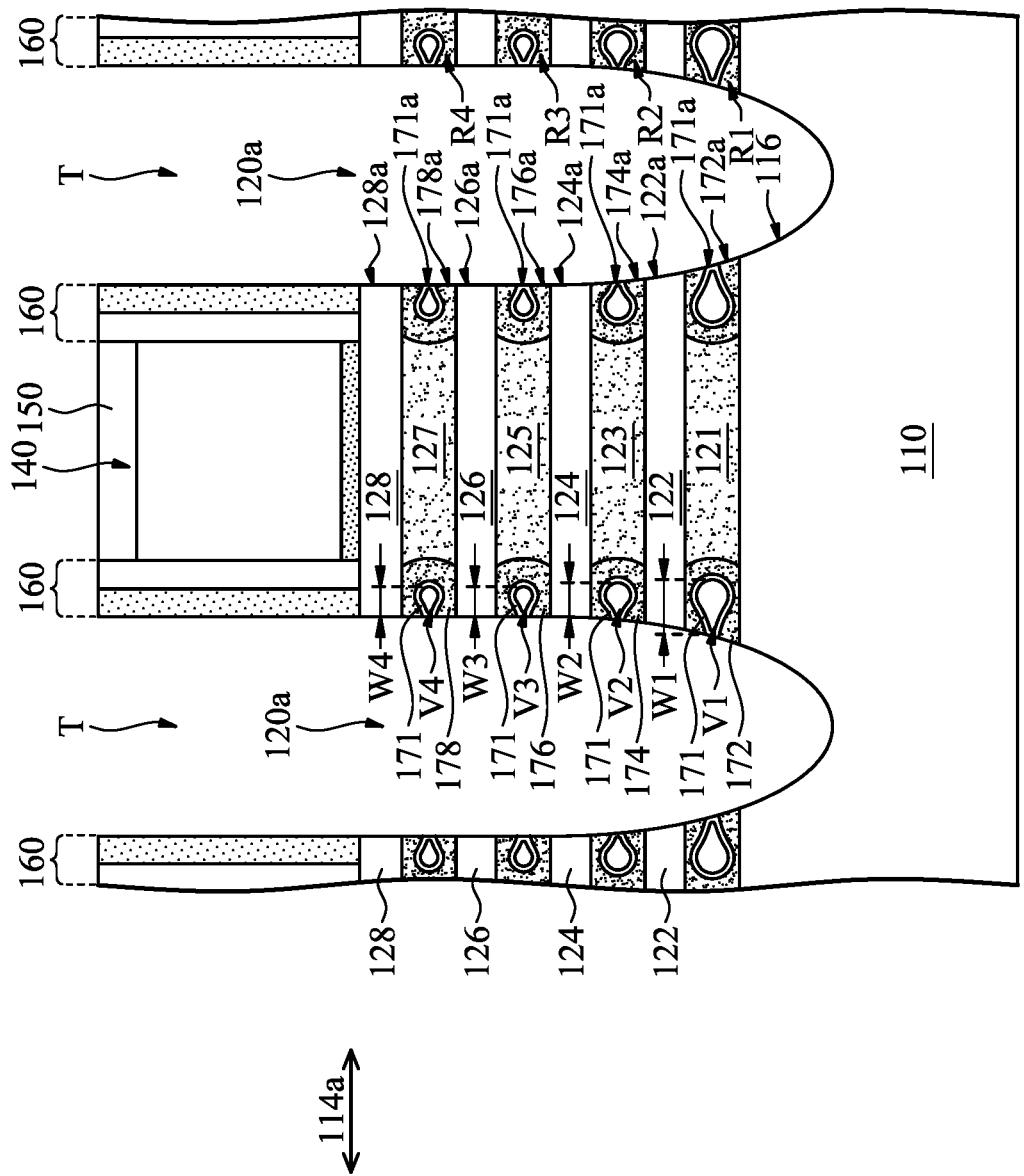
Figure 4C:
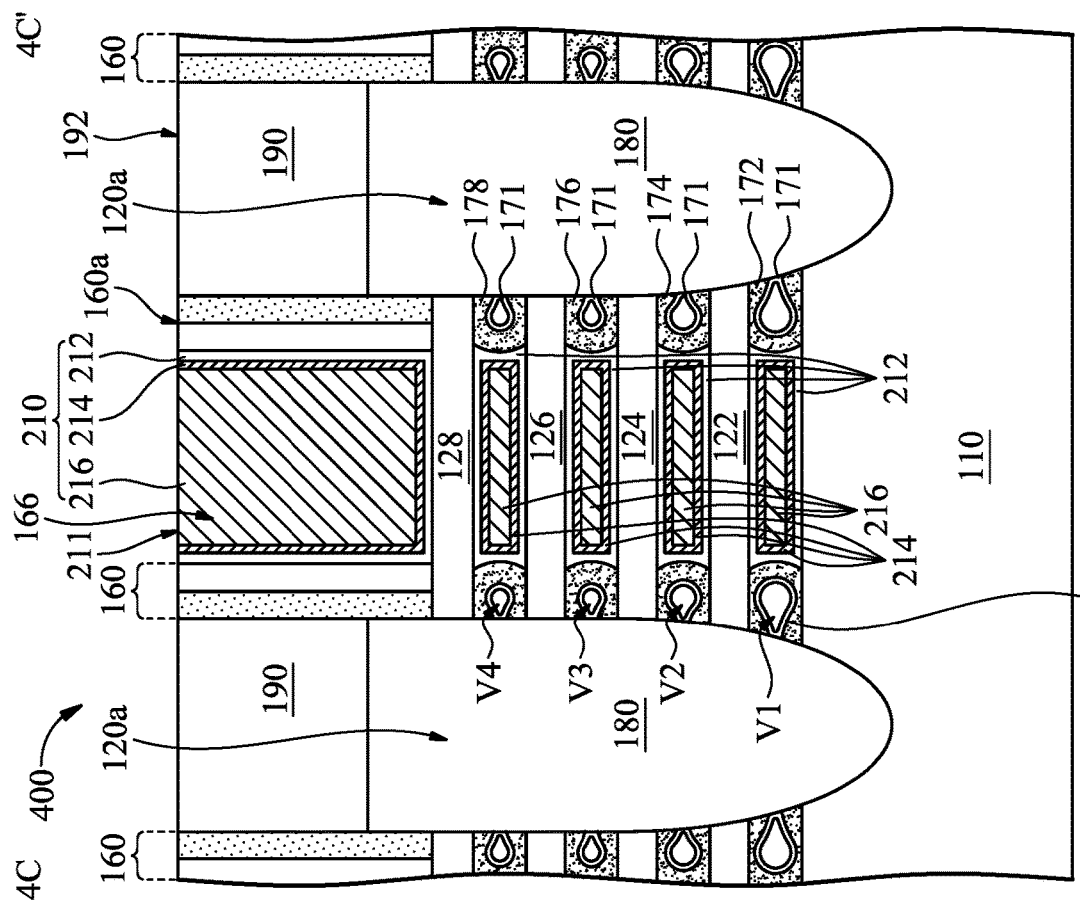
Figures 1, 4C:
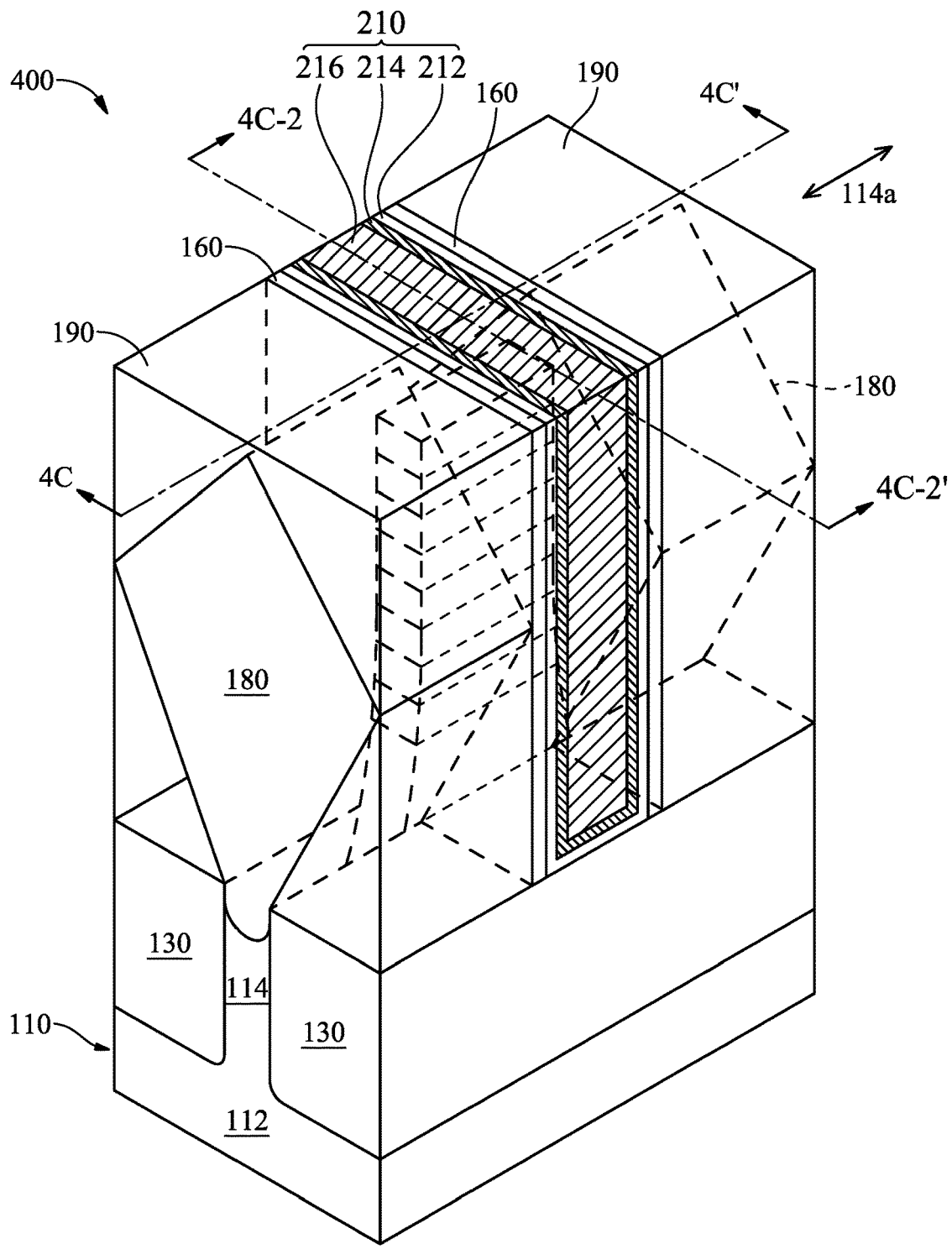
Figures 2, 4C:
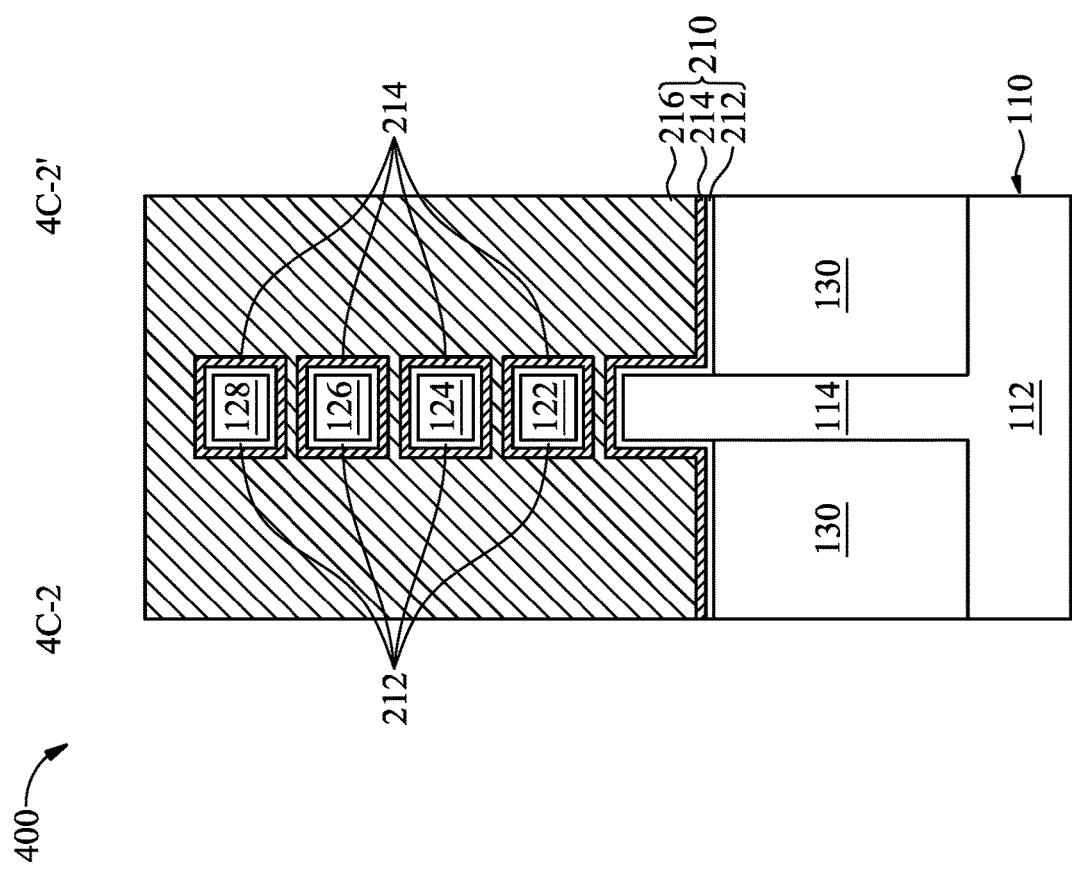

FIGS. 4A-4C are cross-sectional views of various stages of a process for forming a semiconductor device structure, in accordance with some embodiments. After the step of FIG. 1B, as shown in FIG. 4A, end portions of the nanostructures 121, 123, 125 and 127 are removed through the trenches 120a, in accordance with some embodiments. The removal process forms recesses R1, R2, R3 and R4 in the nanostructure stack 120, in accordance with some embodiments. The recess R1 is between the fin 114 and the nanostructure 122, in accordance with some embodiments.

The recess R2 is between the nanostructures 122 and 124, in accordance with some embodiments. The recess R3 is between the nanostructures 124 and 126, in accordance with some embodiments. The recess R4 is between the nanostructures 126 and 128, in accordance with some embodiments. The removal process includes an etching process such as a dry etching process or a wet etching process, in accordance with some embodiments.

As shown in FIG. 4A, an inner spacer material layer 170 is conformally formed over the mask layer 150, the spacer structure 160, the nanostructure stack 120 and the fin 114, in accordance with some embodiments. The recesses R1, R2, R3 and R4 are covered by the inner spacer material layer 170, in accordance with some embodiments. The inner spacer material layer 170 is in direct contact with the nanostructures 121, 122, 123, 124, 125, 126, 127 and 128, in accordance with some embodiments.

The inner spacer material layer 170 has voids V1, V2, V3 and V4, in accordance with some embodiments. The voids V1, V2, V3 and V4 are respectively in the recesses R1, R2, R3 and R4, in accordance with some embodiments. The inner spacer material layer 170 is formed using a deposition process such as a physical vapor deposition process, a chemical vapor deposition process, an atomic layer deposition process, or the like, in accordance with some embodiments.

As shown in FIG. 4A, a film 171 is conformally formed over the inner spacer material layer 170, in accordance with some embodiments. The film 171 conformally covers inner walls of the voids V1, V2, V3 and V4, in accordance with some embodiments. The film 171 and the inner spacer material layer 170 are made of different materials, in accordance with some embodiments. The dielectric constant of the material of the inner spacer material layer 170 is greater than a dielectric constant of the material of the film 171, in accordance with some embodiments.

The film 171 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), or a low-k material, in accordance with some embodiments.

The film 171 is formed using a deposition process such as an atomic layer deposition process, a chemical vapor deposition process, a physical vapor deposition process, or the like. In some embodiments, the inner spacer material layer 170 is formed using a physical vapor deposition process, and the film 171 is formed using an atomic layer deposition process.

As shown in FIGS. 4A and 4B, the portions of the inner spacer material layer 170 and the film 171 outside of the recesses R1, R2, R3 and R4 are removed to form inner spacers 172, 174, 176 and 178 in the recesses R1, R2, R3 and R4 respectively, in accordance with some embodiments.

The inner spacer 172 includes the inner spacer material layer 170 and the film 171 remaining in the recess R1, in accordance with some embodiments. The inner spacer 174 includes the inner spacer material layer 170 and the film 171 remaining in the recess R2, in accordance with some embodiments. The inner spacer 176 includes the inner spacer material layer 170 and the film 171 remaining in the recess R3, in accordance with some embodiments. The inner spacer 178 includes the inner spacer material layer 170 and the film 171 remaining in the recess R4, in accordance with some embodiments.

The void V1 in the inner spacer 172 has a width W1, in accordance with some embodiments. The void V2 in the inner spacer 174 has a width W2, in accordance with some embodiments. The void V3 in the inner spacer 176 has a width W3, in accordance with some embodiments. The void V4 in the inner spacer 178 has a width W4, in accordance with some embodiments.

The width W1 is greater than the width W2, in accordance with some embodiments. That is, the void V1 is wider than the void V2, in accordance with some embodiments. The width W2 is greater than the width W3 or W4, in accordance with some embodiments. That is, the void V2 is wider than the void V3 or V4, in accordance with some embodiments.

The width W3 is substantially equal to the width W4, in accordance with some embodiments. The width W1 ranges from about 5 nm to about 10 nm, in accordance with some embodiments. The width W2 ranges from about 4 nm to about 8 nm, in accordance with some embodiments. The width W3 ranges from about 3 nm to about 6 nm, in accordance with some embodiments. The width W4 ranges from about 3 nm to about 6 nm, in accordance with some embodiments.

In some embodiments, sidewalls 128a, 171a, 178a, 126a, 176a, 124a, 174a, 122a, and 172a of the nanostructure 128, the film 171, the inner spacer 178, the nanostructure 126, the inner spacer 176, the nanostructure 124, the inner spacer 174, the nanostructure 122 and the inner spacer 172 and a surface 116 of the substrate 110 together form a continuous inner wall of the trench 120a, in accordance with some embodiments. Each of the sidewalls 128a, 171a, 178a, 126a, 176a, 124a, 174a, 122a, and 172a and the surface 116 is aligned with the adjacent sidewalls 128a, 171a, 178a, 126a, 176a, 124a, 174a, 122a, and 172a and the adjacent surface 116, in accordance with some embodiments.

As shown in FIG. 4C, stressor structures 180 are formed in the trenches 120a, in accordance with some embodiments. The stressor structures 180 are connected to the nanostructures 122, 124, 126 and 128, in accordance with some embodiments. The stressor structures 180 are in direct contact with the nanostructures 122, 124, 126 and 128, the inner spacers 172, 174, 176 and 178, the film 171, and the substrate 110, in accordance with some embodiments. As shown in FIG. 4C, a dielectric layer 190 is formed over the stressor structures 180, in accordance with some embodiments.

As shown in FIGS. 4B and 4C, the gate stacks 140 and the mask layer 150 are removed, in accordance with some embodiments. The removal process forms a trench 166 in the spacer structure 160, in accordance with some embodiments. As shown in FIGS. 4B and 4C, the nanostructures 121, 123, 125 and 127 are removed through the trench 166, in accordance with some embodiments.

FIG. 4C-1 is a perspective view of the semiconductor device structure of FIG. 4C, in accordance with some embodiments. FIG. 4C-2 is a cross-sectional view illustrating the semiconductor device structure along a sectional line 4C-2-4C-2' in FIG. 4C-1, in accordance with some embodiments.

As shown in FIGS. 4C, 4C-1 and 4C-2, a gate stack 210 is formed in the trench 166, in accordance with some embodiments. In this step, a semiconductor device structure 400 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments.

The work function metal layer 214 is conformally formed over the gate dielectric layer 212, in accordance with some embodiments. The gate electrode layer 216 is formed over the work function metal layer 214, in accordance with some embodiments.

As shown in FIG. 4C, the voids V1, V2, V3 and V4 are filled with air, in accordance with some embodiments. That is, the voids V1, V2, V3 and V4 are air gaps, in accordance with some embodiments. The voids V1, V2, V3 and V4 have a teardrop shape, in accordance with some embodiments. The nanostructure 122 is wider than the nanostructure 124, in accordance with some embodiments. The nanostructure 124 is wider than the nanostructure 126 or 128, in accordance with some embodiments.

The stressor structure 180 adjacent to the inner spacer 172 is narrower than the stressor structure 180 adjacent to the inner spacer 174, in accordance with some embodiments. The stressor structure 180 adjacent to the inner spacer 174 is narrower than the stressor structure 180 adjacent to the inner spacer 176, in accordance with some embodiments. The stressor structure 180 adjacent to the inner spacer 176 and the stressor structure 180 adjacent to the inner spacer 178 have substantially the same width, in accordance with some embodiments.

The dielectric constant of the material of the inner spacers 172, 174, 176 and 178 is greater than a dielectric constant of the material of the film 171, in accordance with some embodiments. Therefore, the inner spacers 172, 174, 176 and 178 with a higher dielectric constant are able to prevent the gate stack 210 from breaking down, in accordance with some embodiments. As a result, the inner spacers 172, 174, 176 and 178 is able to prevent the gate stack 210 and the stressor structures 180 from short circuit, in accordance with some embodiments.

The film 171 with a lower dielectric constant is able to reduce the parasitic capacitance between the gate stack 210 and the stressor structures 180, in accordance with some embodiments. Therefore, the performance of the semiconductor device structure 400 is improved, in accordance with some embodiments.

Figure 5A:
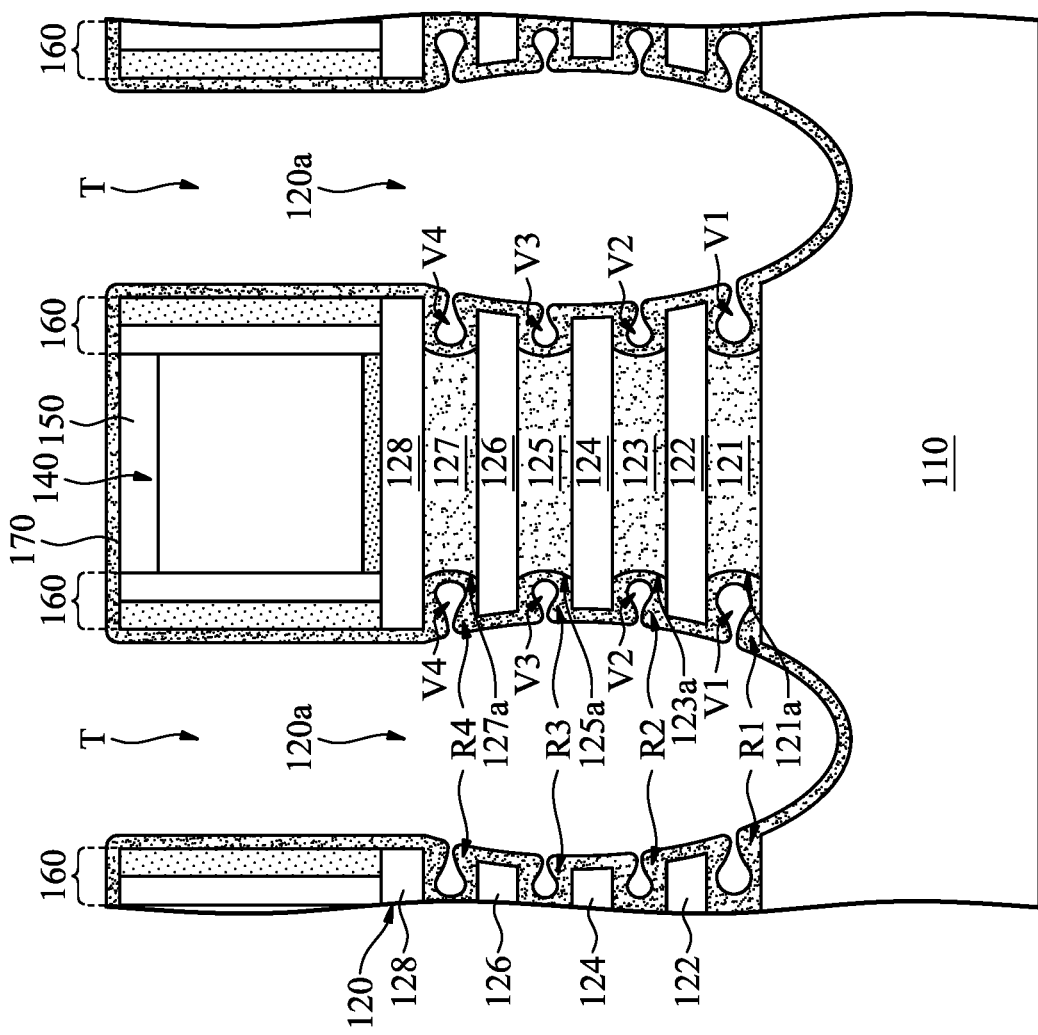
FIGS. 5A-5D are cross-sectional views of various stages of a process for forming a semiconductor device structure, in accordance with some embodiments.

FIGS. 5A-5D are cross-sectional views of various stages of a process for forming a semiconductor device structure, in accordance with some embodiments. After the step of FIG. 2A, as shown in FIG. 5A, end portions of the nanostructures 121, 123, 125 and 127 are removed through the trenches 120*a* and T, in accordance with some embodiments. The removal process forms recesses R1, R2, R3 and R4 in the nanostructure stack 120, in accordance with some embodiments. The recess R1 is between the substrate 110 and the nanostructure 122, in accordance with some embodiments.

The recess R2 is between the nanostructures 122 and 124, in accordance with some embodiments. The recess R3 is between the nanostructures 124 and 126, in accordance with some embodiments. The recess R4 is between the nanostructures 126 and 128, in accordance with some embodiments. The removal process includes an etching process such as a dry etching process or a wet etching process, in accordance with some embodiments.

As shown in FIG. 5A, an inner spacer material layer 170 is conformally formed over the mask layer 150, the spacer structure 160, the nanostructure stack 120 and the fin 114, in accordance with some embodiments. The recesses R1, R2, R3 and R4 are covered by the inner spacer material layer 170, in accordance with some embodiments. The inner spacer material layer 170 is in direct contact with sidewalls 121*a*, 123*a*, 125*a* and 127*a* of the nanostructures 121, 123, 125 and 127, in accordance with some embodiments.

The inner spacer material layer 170 has voids V1, V2, V3 and V4, in accordance with some embodiments. The voids V1, V2, V3 and V4 are respectively in the recesses R1, R2, R3 and R4, in accordance with some embodiments. The inner spacer material layer 170 is formed using a deposition process such as a physical vapor deposition process, a chemical vapor deposition process, an atomic layer deposition process, or the like, in accordance with some embodiments.

Figure 5B:
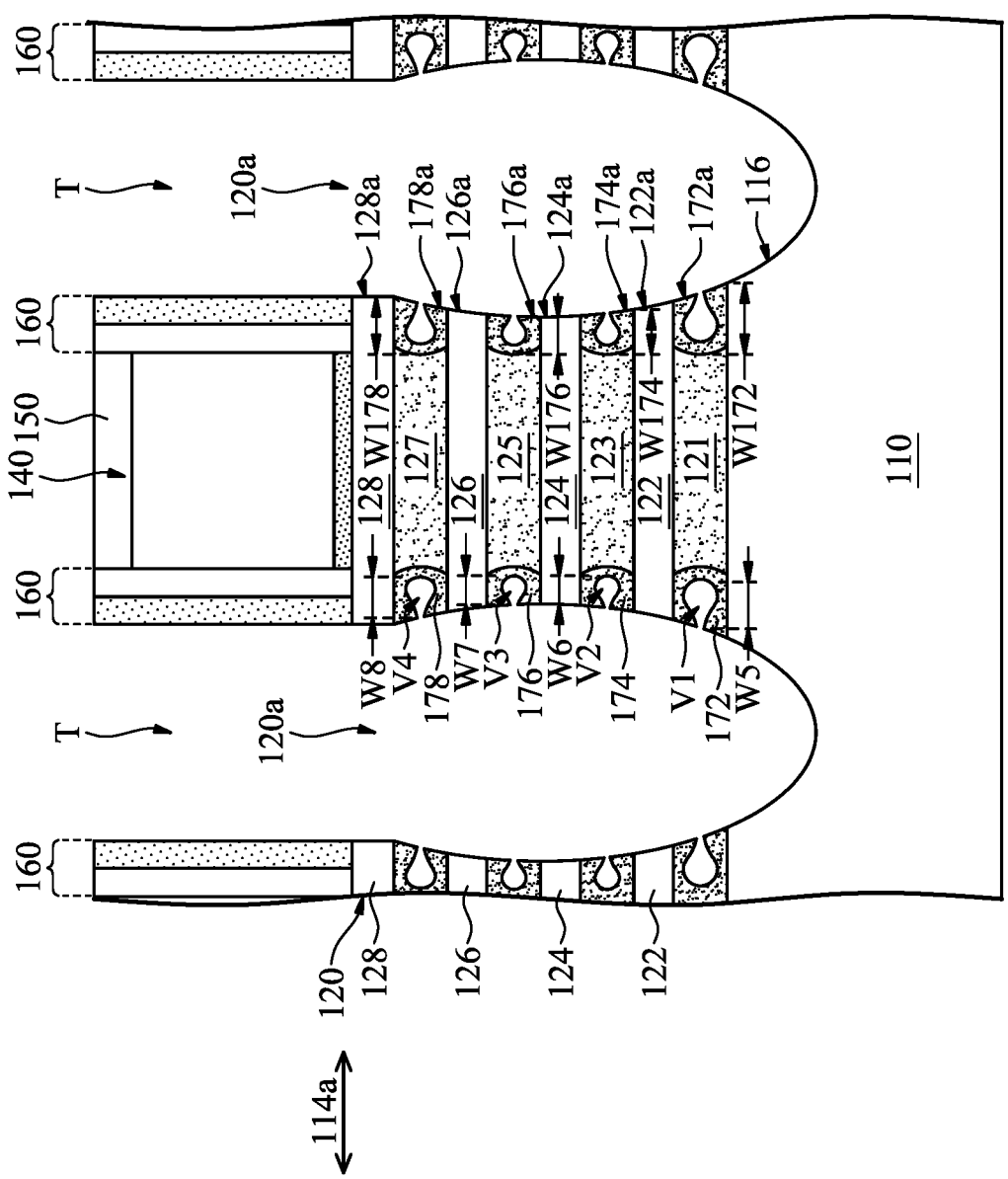

As shown in FIGS. 5A and 5B, the portions of the inner spacer material layer 170 outside of the recesses R1, R2, R3 and R4 are removed to form inner spacers 172, 174, 176 and 178 in the recesses R1, R2, R3 and R4 respectively, in accordance with some embodiments. In some embodiments, the voids V1, V2, V3 and V4 are open voids. In some other embodiments, the voids V1, V2, V3 and V4 are closed voids.

The void V1 has a width W5, in accordance with some embodiments. The void V2 has a width W6, in accordance with some embodiments. The void V3 has a width W7, in accordance with some embodiments. The void V4 has a width W8, in accordance with some embodiments. The width W5 is greater than the width W8, in accordance with some embodiments. That is, the void V1 is wider than the void V4, in accordance with some embodiments. The width W8 is greater than the width W6 or W7, in accordance with some embodiments. That is, the void V4 is wider than the void V2 or V3, in accordance with some embodiments.

The width W6 is substantially equal to the width W7, in accordance with some embodiments. The width W5 ranges from about 4 nm to about 10 nm, in accordance with some embodiments. The width W6 ranges from about 1 nm to about 5 nm, in accordance with some embodiments. The width W7 ranges from about 1 nm to about 5 nm, in accordance with some embodiments. The width W8 ranges from about 3 nm to about 6 nm, in accordance with some embodiments.

Each of the sidewalls 128*a*, 178*a*, 126*a*, 176*a*, 124*a*, 174*a*, 122*a*, and 172*a* of the nanostructure 128, the inner spacer 178, the nanostructure 126, the inner spacer 176, the nanostructure 124, the inner spacer 174, the nanostructure 122 and the inner spacer 172 and a surface 116 of the substrate 110 is aligned with the adjacent sidewalls 128*a*, 178*a*, 126*a*, 176*a*, 124*a*, 174*a*, 122*a*, and 172*a* and the adjacent surface 116, in accordance with some embodiments.

Figure 5C:
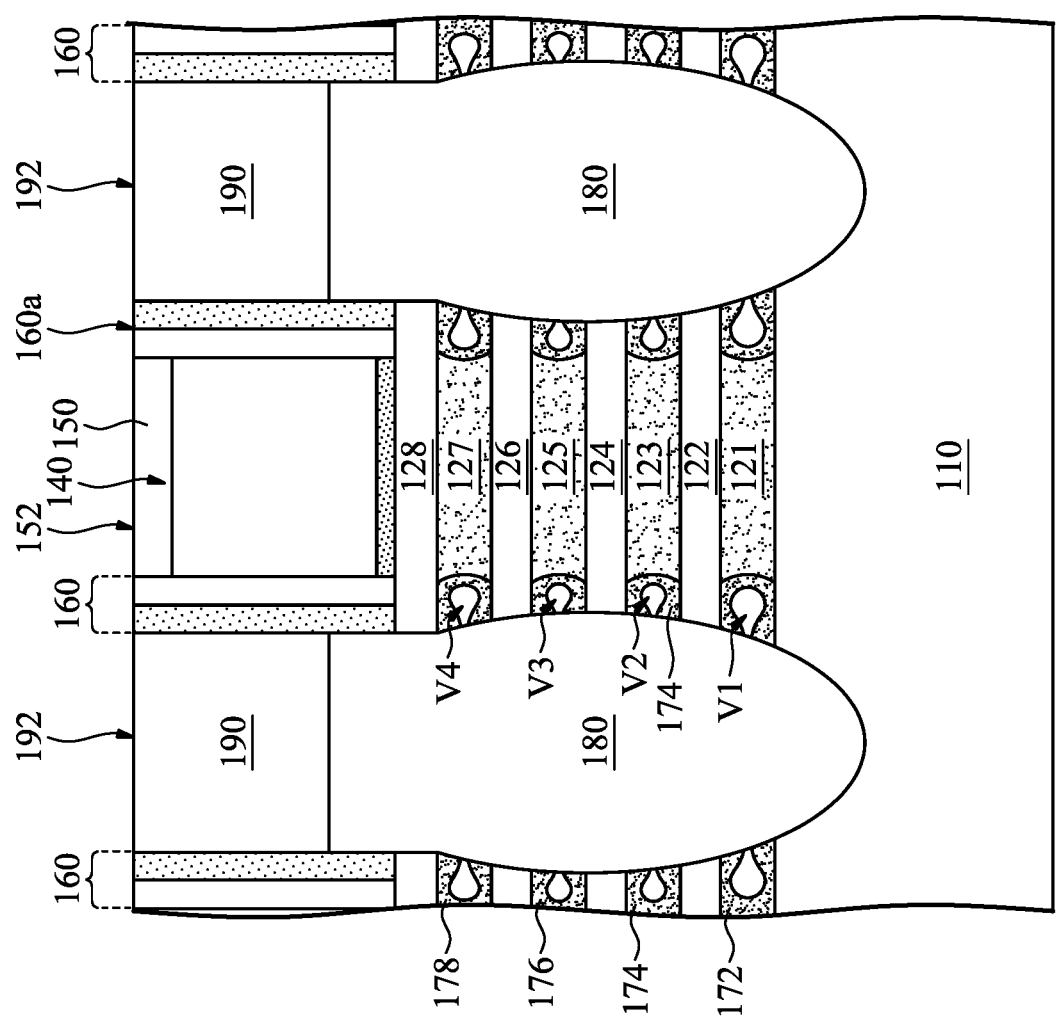

As shown in FIG. 5C, stressor structures 180 are formed in the trenches 120*a*, in accordance with some embodiments. The stressor structures 180 are connected to the nanostructures 122, 124, 126 and 128, in accordance with some embodiments. The stressor structures 180 are in direct contact with the nanostructures 122, 124, 126 and 128, the inner spacers 172, 174, 176 and 178, and the substrate 110, in accordance with some embodiments. As shown in FIG. 5C, a dielectric layer 190 is formed over the stressor structures 180, in accordance with some embodiments.

Figure 5D:
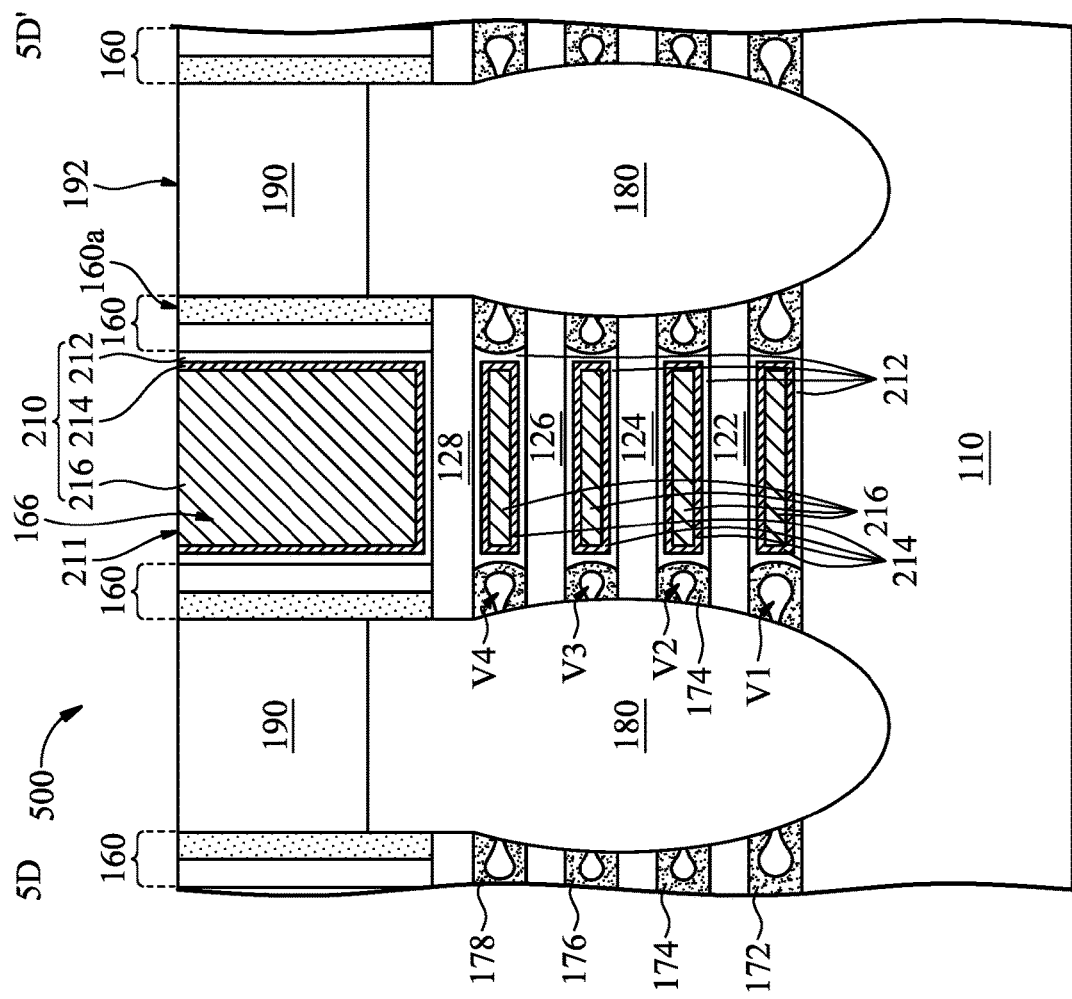
Figures 1, 5D:
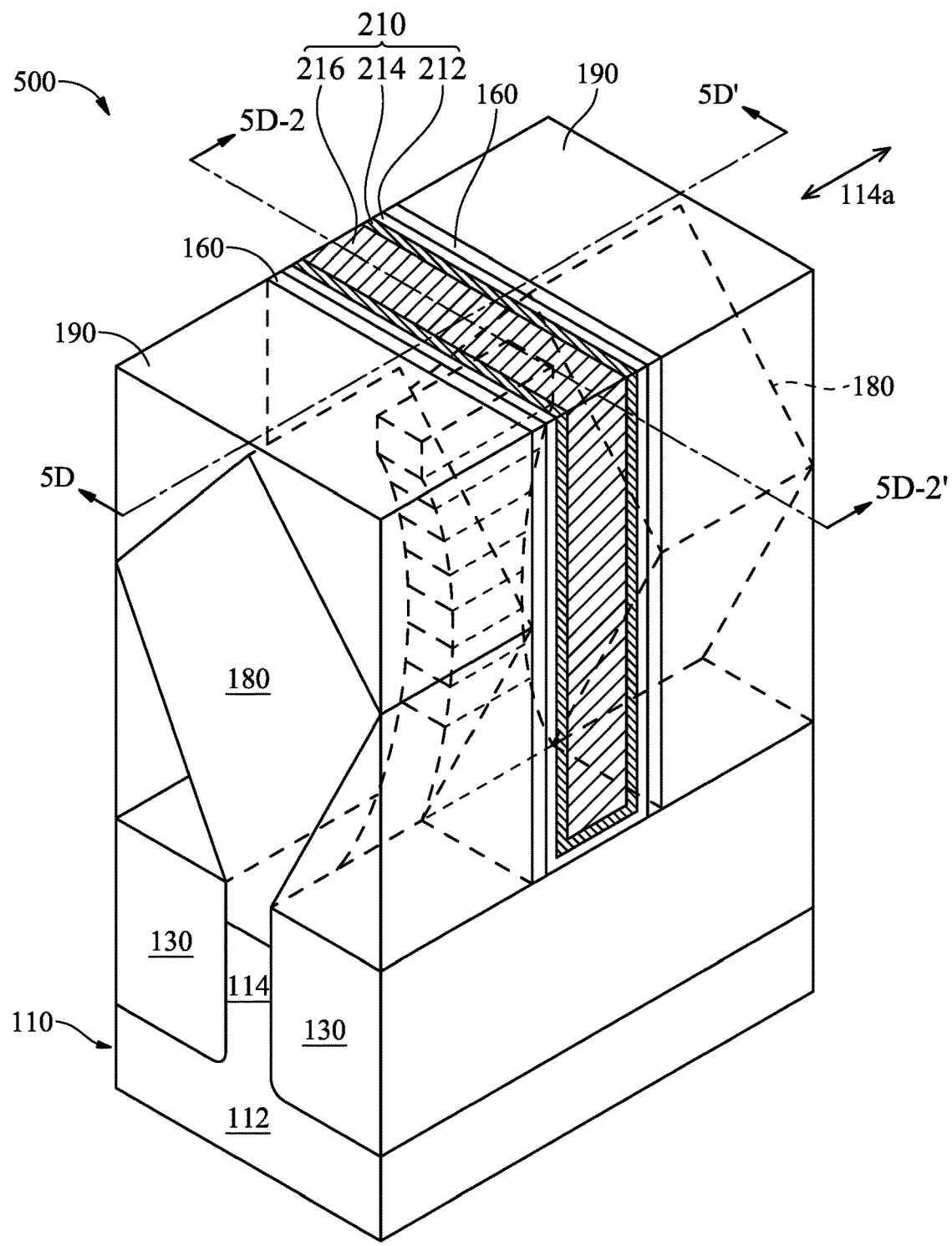
Figures 2, 5D:
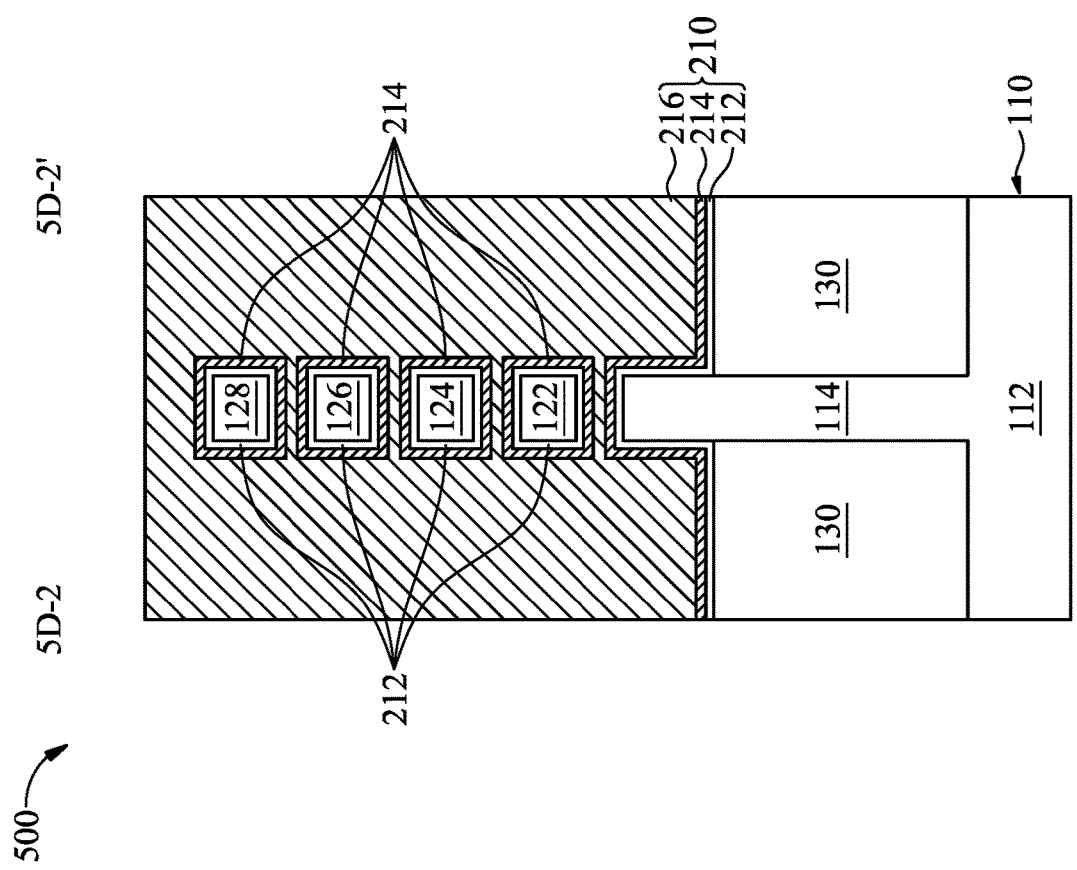

As shown in FIGS. 5C and 5D, the gate stacks 140 and the mask layer 150 are removed, in accordance with some embodiments. The removal process forms a trench 166 in the spacer structure 160, in accordance with some embodiments. As shown in FIGS. 5C and 5D, the nanostructures 121, 123, 125 and 127 are removed through the trench 166, in accordance with some embodiments.

FIG. 5D-1 is a perspective view of the semiconductor device structure of FIG. 5D, in accordance with some embodiments. FIG. 5D-2 is a cross-sectional view illustrating the semiconductor device structure along a sectional line 5D-2-5D-2' in FIG. 5D-1, in accordance with some embodiments.

As shown in FIGS. 5D, 5D-1 and 5D-2, a gate stack 210 is formed in the trench 166, in accordance with some embodiments. In this step, a semiconductor device structure 500 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments.

The work function metal layer 214 is conformally formed over the gate dielectric layer 212, in accordance with some embodiments. The gate electrode layer 216 is formed over the work function metal layer 214, in accordance with some embodiments.

As shown in FIG. 5D, the voids V1, V2, V3 and V4 are filled with air, in accordance with some embodiments. That is, the voids V1, V2, V3 and V4 are air gaps, in accordance with some embodiments. The voids V1, V2, V3 and V4 have a teardrop shape, in accordance with some embodiments. The nanostructure 128 is wider than the nanostructure 122, in accordance with some embodiments. The nanostructure 122 is wider than the nanostructure 126, in accordance with some embodiments. The nanostructure 126 is wider than the nanostructure 124, in accordance with some embodiments.

The stressor structure 180 adjacent to the inner spacer 172 is narrower than the stressor structure 180 adjacent to the inner spacer 174, in accordance with some embodiments. The stressor structure 180 adjacent to the inner spacer 178 is narrower than the stressor structure 180 adjacent to the inner spacer 174 or 176, in accordance with some embodiments.

Figure 6A:
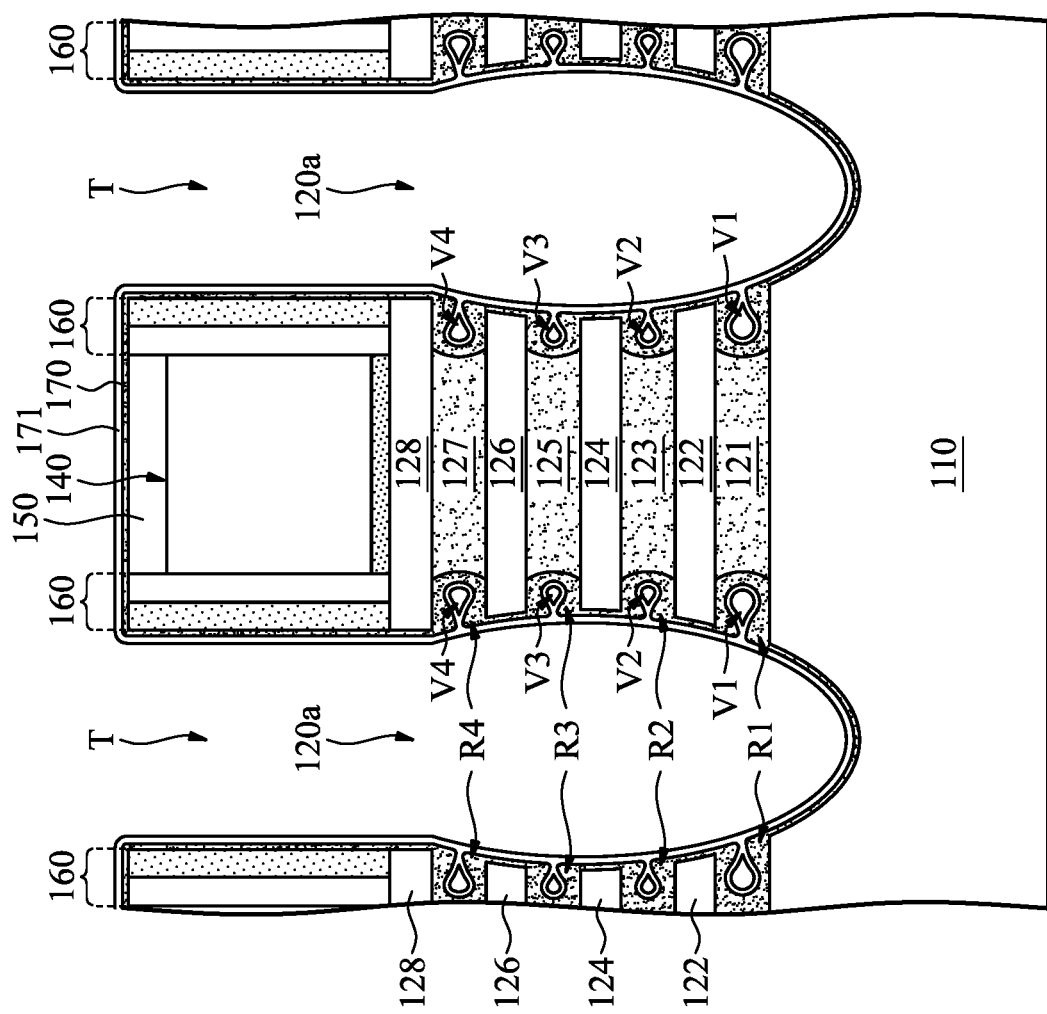
FIGS. 6A-6C are cross-sectional views of various stages of a process for forming a semiconductor device structure, in accordance with some embodiments.
Figure 6B:
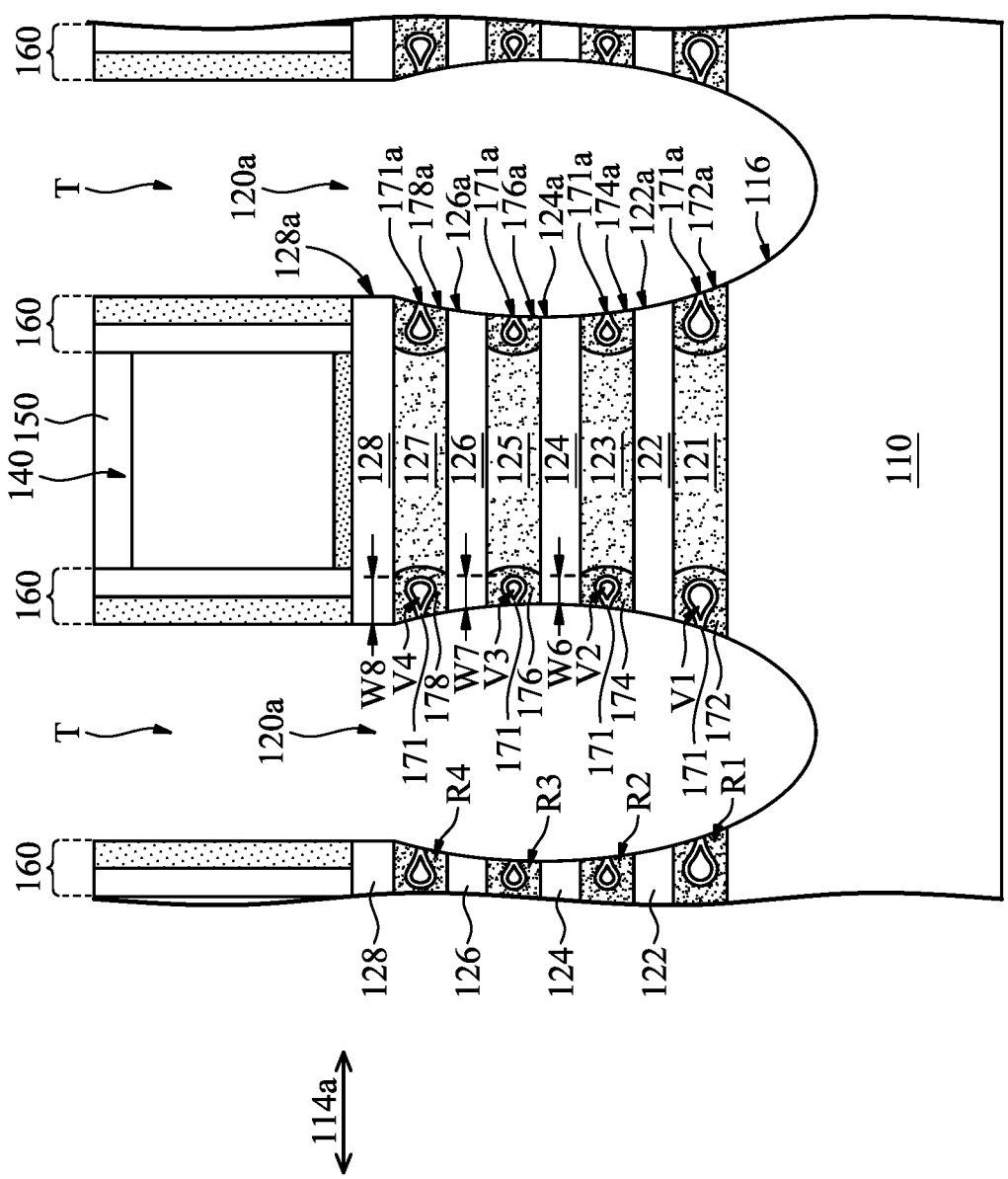
Figure 6C:
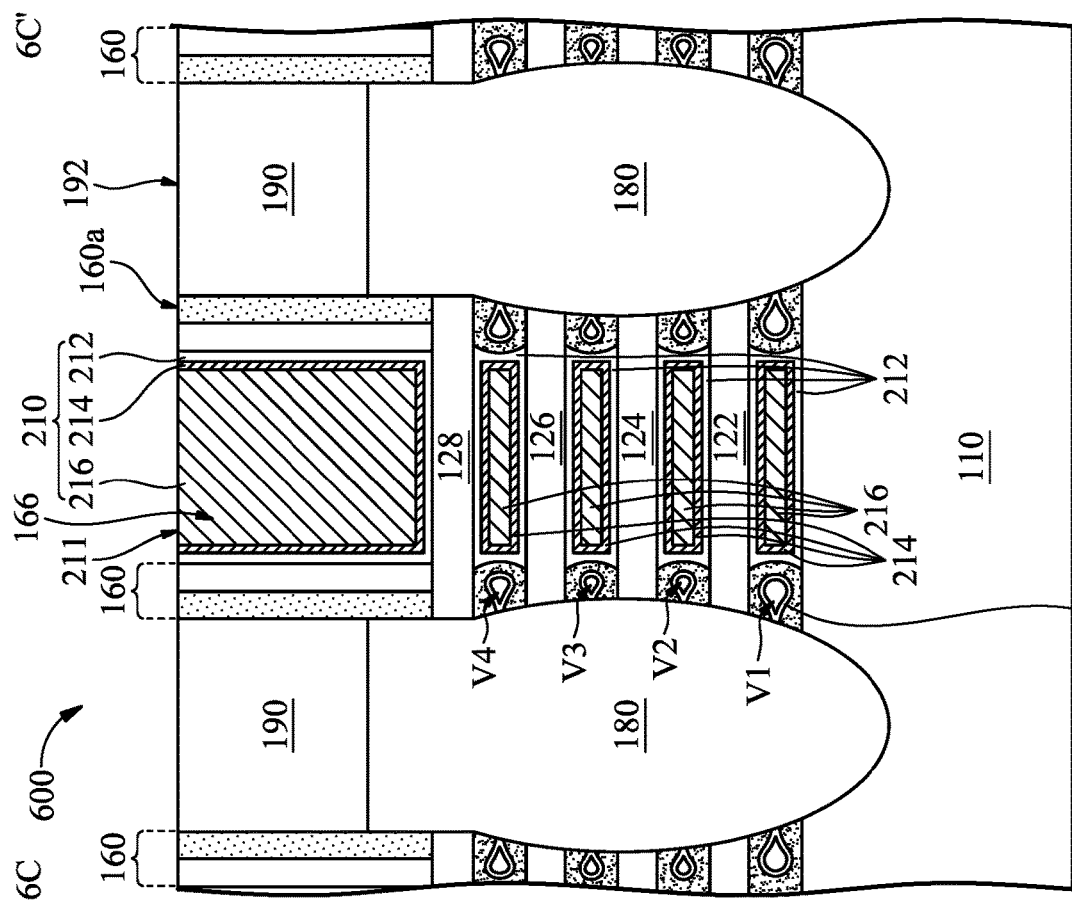
Figures 1, 6C:
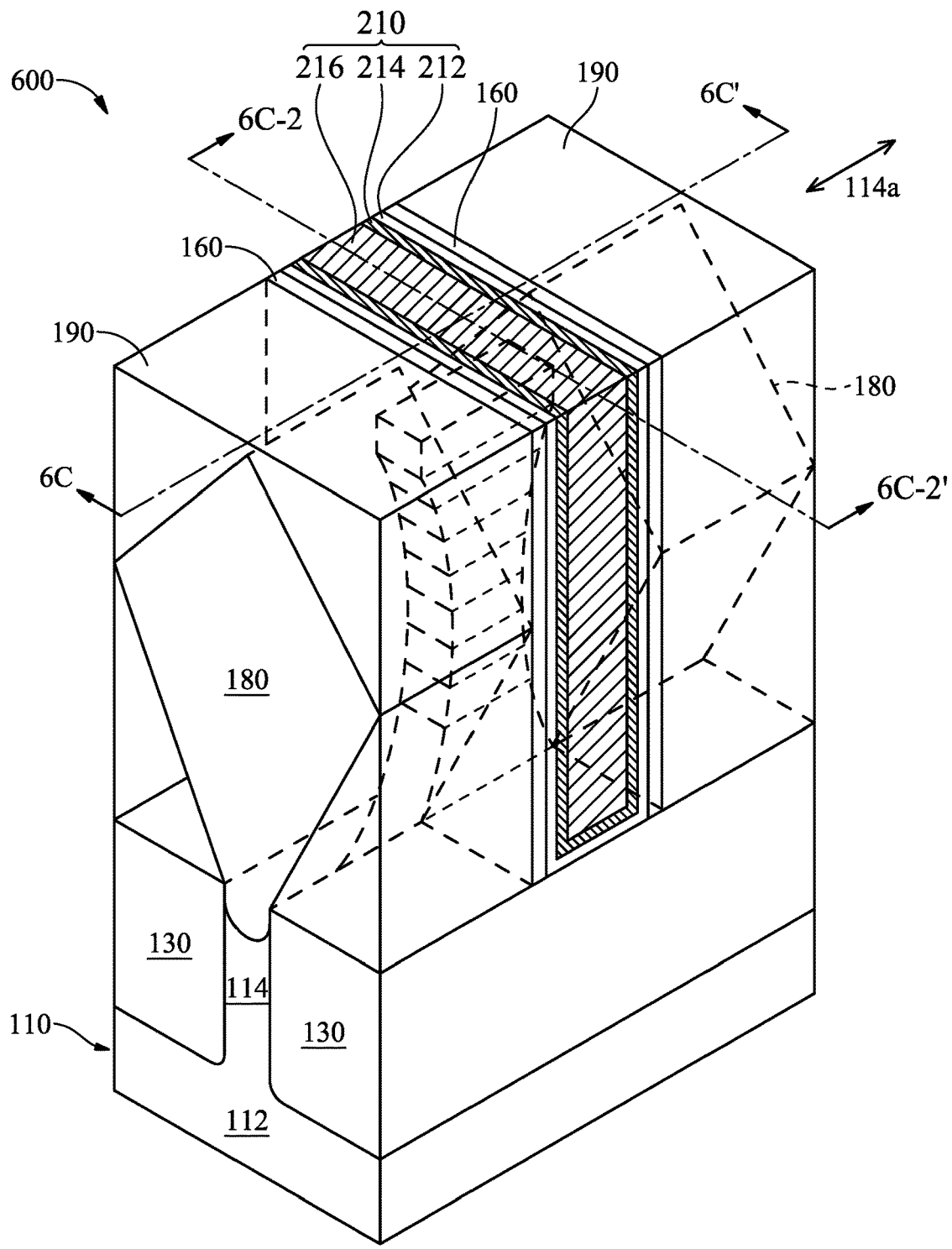
Figures 2, 6C:
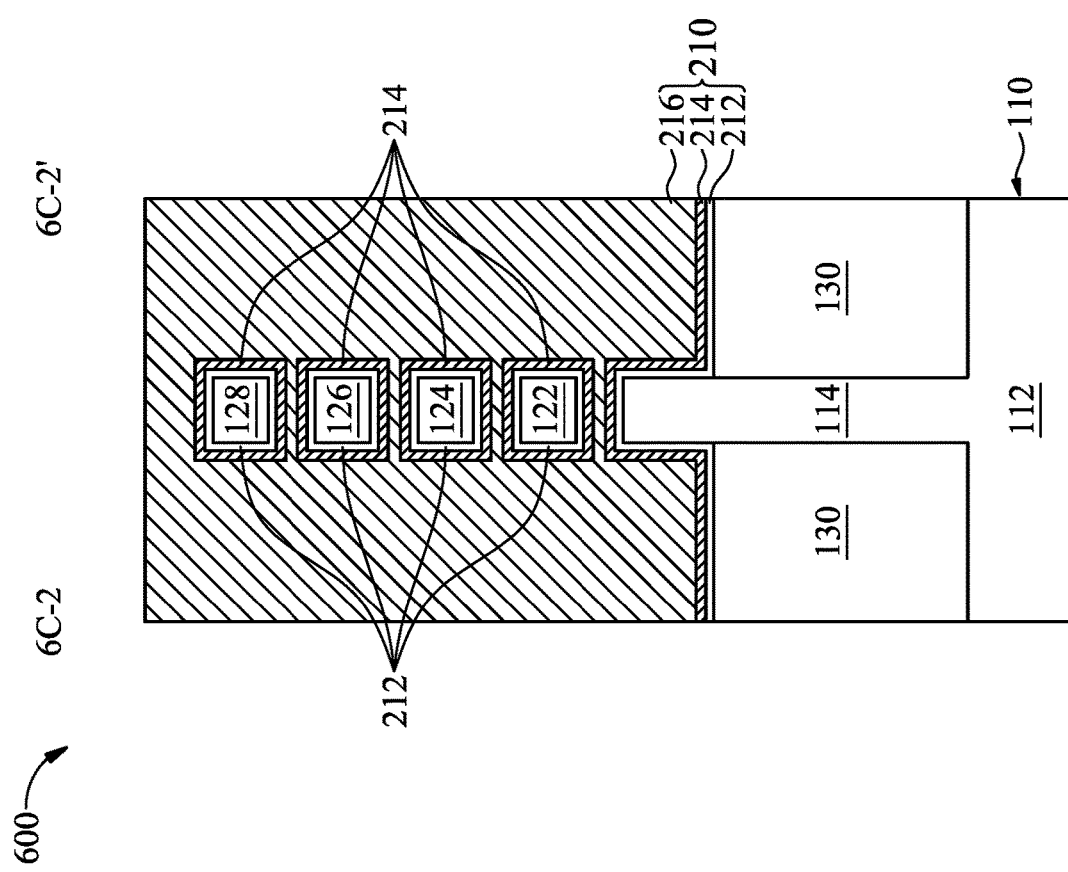

FIGS. 6A-6C are cross-sectional views of various stages of a process for forming a semiconductor device structure, in accordance with some embodiments. After the step of FIG. 5A, as shown in FIG. 6A, a film 171 is conformally formed over the inner spacer material layer 170, in accordance with some embodiments. The film 171 conformally covers inner walls of the voids V1, V2, V3 and V4, in accordance with some embodiments.

The film 171 and the inner spacer material layer 170 are made of different materials, in accordance with some embodiments. The dielectric constant of the material of the inner spacer material layer 170 is greater than a dielectric constant of the material of the film 171, in accordance with some embodiments. In some embodiments, the inner spacer material layer 170 is formed using a physical vapor deposition process, and the film 171 is formed using an atomic layer deposition process.

As shown in FIGS. 6A and 6B, the portions of the inner spacer material layer 170 and the film 171 outside of the recesses R1, R2, R3 and R4 are removed to form inner spacers 172, 174, 176 and 178 in the recesses R1, R2, R3 and R4 respectively, in accordance with some embodiments.

The inner spacer 172 includes the inner spacer material layer 170 and the film 171 remaining in the recess R1, in accordance with some embodiments. The inner spacer 174 includes the inner spacer material layer 170 and the film 171 remaining in the recess R2, in accordance with some embodiments. The inner spacer 176 includes the inner spacer material layer 170 and the film 171 remaining in the recess R3, in accordance with some embodiments. The inner spacer 178 includes the inner spacer material layer 170 and the film 171 remaining in the recess R4, in accordance with some embodiments.

The void V1 in the inner spacer 172 is wider than the void V4 in the inner spacer 178, in accordance with some embodiments. The void V4 is wider than the void V2 in the inner spacer 174 or the void V3 in the inner spacer 176, in accordance with some embodiments.

In some embodiments, sidewalls 128a, 178a, 171a, 126a, 176a, 124a, 174a, 122a, and 172a of the nanostructure 128, the inner spacer 178, the film 171, the nanostructure 126, the inner spacer 176, the nanostructure 124, the inner spacer 174, the nanostructure 122 and the inner spacer 172 and a surface 116 of the substrate 110 together form a continuous inner wall of the trench 120a, in accordance with some embodiments.

Each of the sidewalls 128a, 171a, 178a, 126a, 176a, 124a, 174a, 122a, and 172a and the surface 116 is aligned with the adjacent sidewalls 128a, 171a, 178a, 126a, 176a, 124a, 174a, 122a, and 172a and the adjacent surface 116, in accordance with some embodiments.

As shown in FIGS. 6B and 6C, stressor structures 180 are formed in the trenches 120a, in accordance with some embodiments. The stressor structures 180 are connected to the nanostructures 122, 124, 126 and 128, in accordance with some embodiments. As shown in FIG. 6C, a dielectric layer 190 is formed over the stressor structures 180, in accordance with some embodiments.

As shown in FIGS. 6B and 6C, the gate stacks 140 and the mask layer 150 are removed, in accordance with some embodiments. The removal process forms a trench 166 in the spacer structure 160, in accordance with some embodiments. As shown in FIGS. 6B and 6C, the nanostructures 121, 123, 125 and 127 are removed through the trench 166, in accordance with some embodiments.

FIG. 6C-1 is a perspective view of the semiconductor device structure of FIG. 6C, in accordance with some embodiments. FIG. 6C-2 is a cross-sectional view illustrating the semiconductor device structure along a sectional line 6C-2-6C-2' in FIG. 6C-1, in accordance with some embodiments.

As shown in FIGS. 6C, 6C-1 and 6C-2, a gate stack 210 is formed in the trench 166, in accordance with some embodiments. In this step, a semiconductor device structure 600 is substantially formed, in accordance with some embodiments. The gate stack 210 surrounds the nanostructures 122, 124, 126 and 128, in accordance with some embodiments.

The gate stack 210 includes a gate dielectric layer 212, a work function metal layer 214, and a gate electrode layer 216, in accordance with some embodiments. The gate dielectric layer 212 conformally covers the nanostructures 122, 124, 126 and 128 and inner walls and a bottom surface of the trench 166, in accordance with some embodiments.

The work function metal layer 214 is conformally formed over the gate dielectric layer 212, in accordance with some embodiments. The gate electrode layer 216 is formed over the work function metal layer 214, in accordance with some embodiments.

As shown in FIG. 6C, the voids V1, V2, V3 and V4 are filled with air, in accordance with some embodiments. That is, the voids V1, V2, V3 and V4 are air gaps, in accordance with some embodiments. The voids V1, V2, V3 and V4 have a teardrop shape, in accordance with some embodiments. The nanostructure 128 is wider than the nanostructure 122, in accordance with some embodiments. The nanostructure 122 is wider than the nanostructure 126, in accordance with some embodiments. The nanostructure 126 is wider than the nanostructure 124, in accordance with some embodiments.

Processes and materials for forming the semiconductor device structure 200, 300, 400, 500 and 600 may be similar to, or the same as, those for forming the semiconductor device structure 100 described above.

In accordance with some embodiments, semiconductor device structures and methods for forming the same are provided. The methods (for forming the semiconductor device structure) form inner spacers between a gate stack and a stressor structure to prevent the gate stack and the stressor structures from short circuit. The inner spacers have different sizes (e.g., width) according to design requirements. The inner spacers have air voids to reduce the dielectric constant of the inner spacers and therefore reduce the parasitic capacitance between the gate stack and the stressor structure. Therefore, the performance of the semiconductor device structure is improved.

In accordance with some embodiments, a semiconductor device structure is provided. The semiconductor device structure includes a substrate having a base and a fin over the base. The semiconductor device structure includes a gate stack wrapping around a top portion of the fin. The semiconductor device structure includes a first nanostructure over the fin and passing through the gate stacks. The semiconductor device structure includes a second nanostructure over the first nanostructure and passing through the gate stacks. The gate stacks has a first portion and a second portion, the first portion is between the first nanostructure and the fin, and the second portion is between the first nanostructure and the second nanostructure. The semiconductor device structure includes a stressor structure over the fin and connected to the first nanostructure and the second nanostructure. The semiconductor device structure includes a first inner spacer between the first portion and the stressor structure. The semiconductor device structure includes a second inner spacer between the second portion and the stressor structure. The first inner spacer is wider than the second inner spacer.

In accordance with some embodiments, a semiconductor device structure is provided. The semiconductor device structure includes a substrate having a base and a fin over the base. The semiconductor device structure includes a first nanostructure over the fin. The semiconductor device structure includes a second nanostructure over the first nanostructure. The fin, the first nanostructure, and the second nanostructure are spaced apart from each other. The semiconductor device structure includes a gate stack wrapping around the first nanostructure, the second nanostructure, and a top portion of the fin. The gate stacks has a first portion and a second portion, the first portion is between the first nanostructure and the fin, and the second portion is between the first nanostructure and the second nanostructure. The semiconductor device structure includes a stressor structure over the fin and connected to the first nanostructure and the second nanostructure. The semiconductor device structure includes a first inner spacer between the first portion and the stressor structure. The first inner spacer has a first void. The semiconductor device structure includes a second inner spacer between the second portion and the stressor structure. The second inner spacer has a second void, and the first void is wider than the second void.

In accordance with some embodiments, a method for forming a semiconductor device structure is provided. The method includes providing a substrate having a base and a fin over the base. The method includes forming a nanostructure stack over the fin. The nanostructure stack comprises a first nanostructure, a second nanostructure, a third nanostructure, and a fourth nanostructure sequentially formed over the fin. The method includes forming a gate stack over the nanostructure stack and the fin. The method includes partially removing the nanostructure stack and the fin, which are not covered by the gate stack, to form a trench in the nanostructure stack and the fin. The method includes removing end portions of the first nanostructure and the third nanostructure through the trench to form a first recess and a second recess in the nanostructure stack. The first recess is between the fin and the second nanostructure, the second recess is between the second nanostructure and the fourth nanostructure, and the first recess is wider than the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a substrate having a base and a fin over the base;
   a first nanostructure over the fin;
   a second nanostructure over the first nanostructure;
   a gate stack wrapping around an upper portion of the fin, the first nanostructure, and the second nanostructure;
   a first inner spacer between the fin and the first nanostructure;
   a second inner spacer between the first nanostructure and the second nanostructure;
   a first low dielectric constant structure in the first inner spacer; and
   a second low dielectric constant structure in the second inner spacer, wherein the first low dielectric constant structure is larger than the second low dielectric constant structure.

2. The semiconductor device structure as claimed in claim 1, wherein the first low dielectric constant structure is a film.

3. The semiconductor device structure as claimed in claim 2, wherein the first low dielectric constant structure conformally covers an inner wall of the first inner spacer.

4. The semiconductor device structure as claimed in claim 1, wherein the first low dielectric constant structure is wider than the second low dielectric constant structure.

5. The semiconductor device structure as claimed in claim 1, wherein the first low dielectric constant structure is thicker than the second low dielectric constant structure.

6. The semiconductor device structure as claimed in claim 1, wherein the first low dielectric constant structure is an air gap.

7. The semiconductor device structure as claimed in claim 6, wherein the air gap is a closed air gap.

8. The semiconductor device structure as claimed in claim 1, further comprising:
   a third nanostructure over the second nanostructure and surrounded by the gate stack; and
   a third inner spacer between the second nanostructure and the third nanostructure, wherein the third inner spacer is wider than the second inner spacer.

9. The semiconductor device structure as claimed in claim 8, wherein the third inner spacer is narrower than the first inner spacer.

10. The semiconductor device structure as claimed in claim 9, wherein the third nanostructure is wider than the first nanostructure, and the first nanostructure is wider than the second nanostructure.

11. The semiconductor device structure as claimed in claim 1, wherein a first dielectric constant of a first material of the first low dielectric constant structure is about 1, and a second dielectric constant of a second material of the second low dielectric constant structure is about 1.

12. A semiconductor device structure, comprising:
    a substrate;
    a first nanostructure over the substrate;
    a second nanostructure over the first nanostructure, wherein the substrate, the first nanostructure, and the second nanostructure are spaced apart from each other;
    a gate stack wrapping around the first nanostructure and the second nanostructure;
    a first inner spacer between the substrate and the first nanostructure;
    a first low dielectric constant structure between the substrate and the first nanostructure, wherein the first low dielectric constant structure has a first taper end, and the first low dielectric constant structure is surrounded by the first inner spacer;
    a second inner spacer between the first nanostructure and the second nanostructure; and
    a second low dielectric constant structure between the first nanostructure and the second nanostructure, wherein the second low dielectric constant structure has a second taper end.

13. The semiconductor device structure as claimed in claim 12, wherein the second low dielectric constant structure is surrounded by the second inner spacer.

14. The semiconductor device structure as claimed in claim 12, wherein the first taper end of the first low dielectric constant structure and the second taper end of the second low dielectric constant structure taper away from the gate stack.

15. The semiconductor device structure as claimed in claim 12, wherein the first low dielectric constant structure comprises an air gap.

16. A semiconductor device structure, comprising:
- a substrate;
- a first nanostructure over the substrate;
- a second nanostructure over the first nanostructure;
- a gate stack wrapping around the first nanostructure and the second nanostructure;
- a first inner spacer between the substrate and the first nanostructure;
- a first low dielectric constant structure between the substrate and the first nanostructure, wherein the first low dielectric constant structure has a first width;
- a second inner spacer between the first nanostructure and the second nanostructure; and
- a second low dielectric constant structure between the first nanostructure and the second nanostructure, wherein the second low dielectric constant structure has a second width, and the first width is different from the second width in a cross-sectional view of the first low dielectric constant structure and the second low dielectric constant structure.

17. The semiconductor device structure as claimed in claim 16, wherein the first low dielectric constant structure has a first thickness, the second low dielectric constant structure has a second thickness, and the first thickness is different from the second thickness.

18. The semiconductor device structure as claimed in claim 16, wherein the first low dielectric constant structure has a teardrop shape.

19. The semiconductor device structure as claimed in claim 16, wherein the first low dielectric constant structure has a first volume, the second low dielectric constant structure has a second volume, and the first volume is different from the second volume.

20. The semiconductor device structure as claimed in claim 16, wherein the first width is greater than the second width.

\* \* \* \* \*